(12) United States Patent
Takahashi et al.

(10) Patent No.: US 9,142,519 B2
(45) Date of Patent: Sep. 22, 2015

(54) SEMICONDUCTOR DEVICE WITH COVERING MEMBER THAT PARTIALLY COVERS WIRING SUBSTRATE

(71) Applicant: Renesas Electronics Corporation, Kawasaki-shi, Kanagawa (JP)

(72) Inventors: Satoshi Takahashi, Kanagawa (JP); Shuuichi Kariyazaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/447,181

(22) Filed: Jul. 30, 2014

(65) Prior Publication Data

US 2015/0061104 A1 Mar. 5, 2015

(30) Foreign Application Priority Data

Sep. 3, 2013 (JP) .................................. 2013-182363

(51) Int. Cl.
*H01L 23/50* (2006.01)
*H01L 23/00* (2006.01)
*H01L 23/373* (2006.01)
*H01L 23/544* (2006.01)
*H01L 21/50* (2006.01)
*H01L 23/367* (2006.01)

(52) U.S. Cl.
CPC ................ *H01L 24/09* (2013.01); *H01L 21/50* (2013.01); *H01L 23/3736* (2013.01); *H01L 23/544* (2013.01); *H01L 24/74* (2013.01); *H01L 23/3675* (2013.01); *H01L 23/50* (2013.01); *H01L 23/562* (2013.01); *H01L 2223/5442* (2013.01); *H01L 2223/54426* (2013.01); *H01L 2223/54486* (2013.01); *H01L 2224/0913* (2013.01); *H01L 2924/01029* (2013.01); *H01L 2924/0132* (2013.01); *H01L 2924/01079* (2013.01); *H01L 2924/13091* (2013.01)

(58) Field of Classification Search
CPC ............................ H01L 23/544; H01L 23/562
USPC .................................................. 257/704, 734
See application file for complete search history.

(56) References Cited

U.S. PATENT DOCUMENTS

| | | | | |
|---|---|---|---|---|
| 5,789,810 A * | 8/1998 | Gross et al. | .................... | 257/704 |
| 5,898,219 A * | 4/1999 | Barrow | ......................... | 257/713 |
| 6,225,694 B1 * | 5/2001 | Terui | ............................. | 257/704 |
| 6,246,115 B1 * | 6/2001 | Tang et al. | .................... | 257/706 |
| 6,294,408 B1 * | 9/2001 | Edwards et al. | ............. | 438/121 |

(Continued)

FOREIGN PATENT DOCUMENTS

| | | |
|---|---|---|
| JP | 05-275552 A | 10/1993 |
| JP | 2012-054597 A | 3/2012 |

*Primary Examiner* — Nathan Ha
(74) *Attorney, Agent, or Firm* — Sughrue Mion, PLLC

(57) ABSTRACT

An error is prevented from being generated at a mounting position of an electronic component on a wiring substrate. A first semiconductor chip has a main surface and a rear surface. The rear surface is an opposite surface of the main surface. The rear surface of the first semiconductor chip is an opposite surface of the main surface thereof. A wiring substrate is rectangular, and has a main surface and a rear surface. The first semiconductor chip is mounted on the main surface of the wiring substrate. A lid covers the main surface of the wiring substrate, and the first semiconductor chip. An electronic component is mounted on the rear surface of the wiring substrate. The main surface of the wiring substrate has uncovered regions that are not covered with the lid at at least two corners facing each other.

10 Claims, 31 Drawing Sheets

(56) References Cited

U.S. PATENT DOCUMENTS

| | | | |
|---|---|---|---|
| 6,608,380 B2 * | 8/2003 | Ro et al. | 257/712 |
| 6,653,730 B2 * | 11/2003 | Chrysler et al. | 257/704 |
| 6,720,647 B2 * | 4/2004 | Fukuizumi | 257/704 |
| 7,253,515 B2 | 8/2007 | Horie et al. | |
| 8,421,217 B2 * | 4/2013 | Casey et al. | 257/704 |
| 2006/0171127 A1 * | 8/2006 | Kadoya et al. | 361/752 |

* cited by examiner

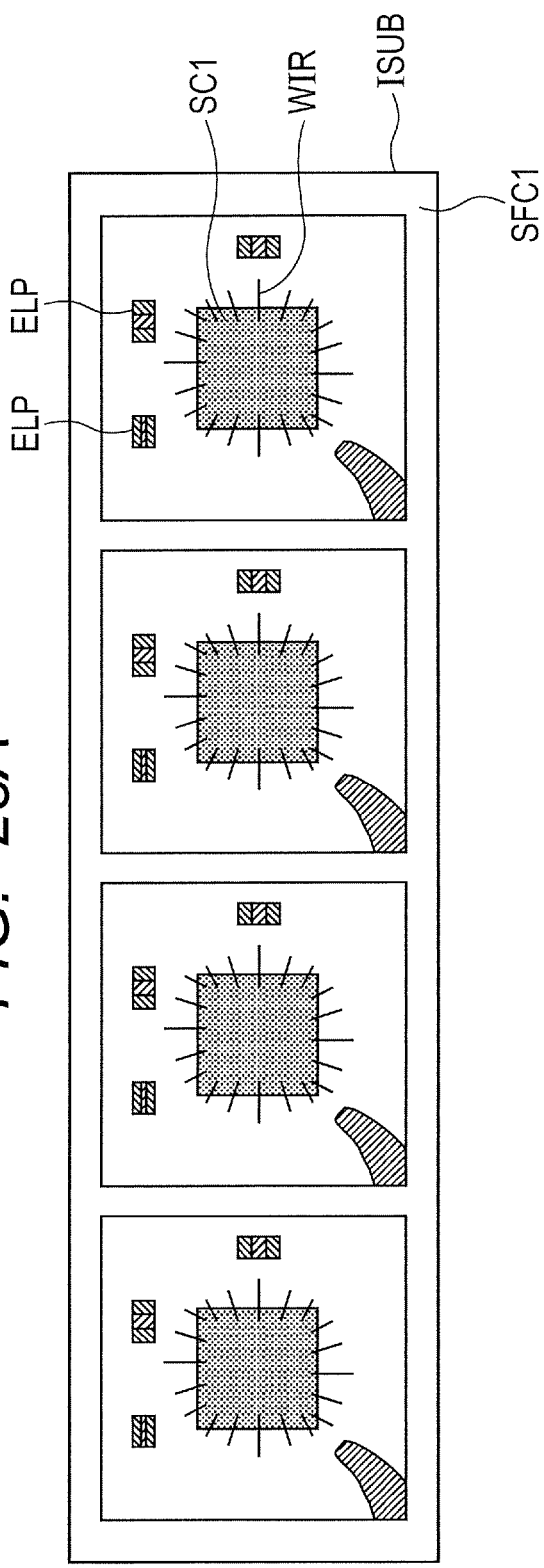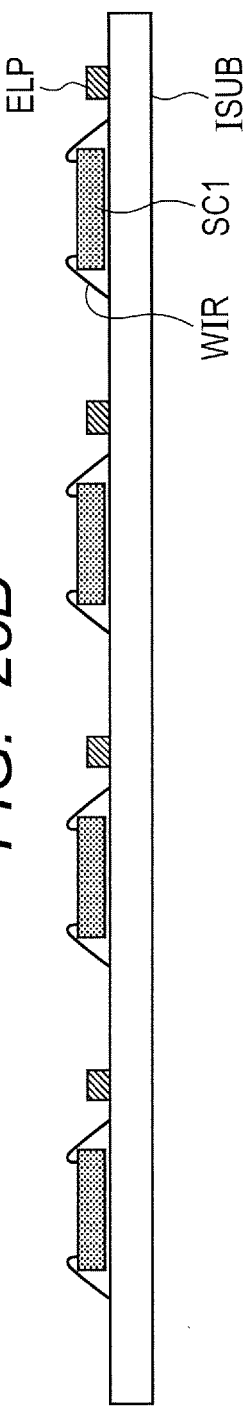

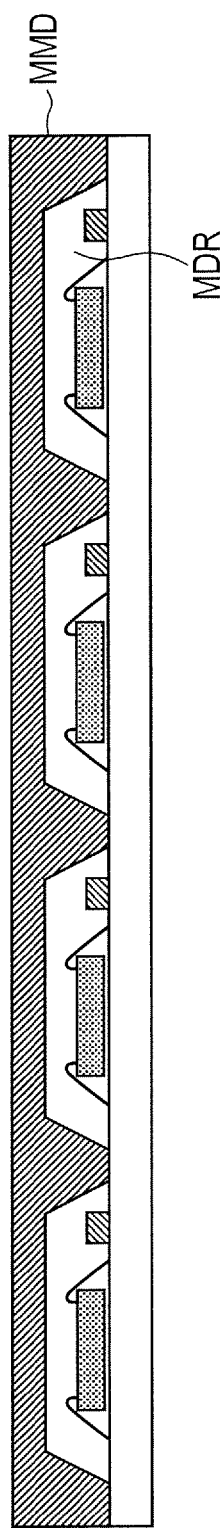
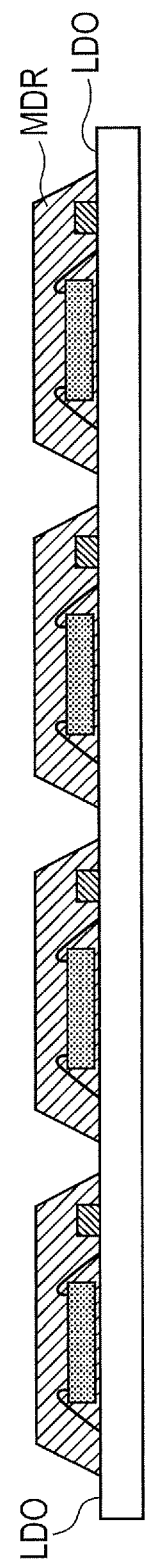
FIG. 29A
FIG. 29B

SEMICONDUCTOR DEVICE WITH COVERING MEMBER THAT PARTIALLY COVERS WIRING SUBSTRATE

CROSS-REFERENCE TO RELATED APPLICATIONS

The disclosure of Japanese Patent Application No. 2013-182363 filed on Sep. 3, 2013 including the specification, drawings and abstract is incorporated herein by reference in its entirety.

BACKGROUND

The present invention relates to a semiconductor device, for example, a technique that can be applied to a semiconductor device in which a semiconductor chip is mounted on a main surface of a wiring substrate.

As one of methods for mounting a semiconductor chip on the wiring substrate, there is a flip-chip structure. In the flip-chip structure, a surface of a semiconductor chip on which an electrode pad is formed is faced toward the wiring substrate side, and the semiconductor chip is mounted on the wiring substrate with the use of a terminal disposed on the electrode pad. In the flip-chip structure, a lid may be provided for the purpose of radiating heat from the semiconductor chip, or protecting the semiconductor chip (for example, refer to Japanese Unexamined Patent Application Publication No. 2012-54597).

Japanese Unexamined Patent Application Publication No. Hei 5(1993)-275552 discloses that corners of an insulating base on which an electronic component such as a piezoelectric vibrator is mounted are notched.

SUMMARY

The present inventors have studied that, in order to downsize an electronic device having the semiconductor device, electronic components (for example, a capacitive element or a resistive element) that have been mounted on a mother board up to now is mounted on a surface of the wiring substrate on which no semiconductor chip is mounted. In order to conduct this mounting, there is a need to retain a first surface side of the wiring substrate to a retention jig after the semiconductor chip and a covering member such as the lid have been arranged on the first surface of the wiring substrate. In this case, the covering member may be abutted against the retention jig to indirectly determine a position of the wiring substrate relative to the retention jig.

On the other hand, because the covering member is fixed to the wiring substrate with the use of an adhesion layer, the covering member may be inclined with respect to the first surface of the wiring substrate. In this case, the position of the wiring substrate relative to the retention jig has the potential to vary. When the position is varied, an error is generated in the mounting position of the electronic component on the wiring substrate. The other problems and novel features will become apparent from the description of the present specification and the attached drawings.

According to an embodiment, a first semiconductor chip is mounted on a main surface of a wiring substrate. A lid covers the main surface of the wiring substrate, and the first semiconductor chip. An electronic component is mounted on a rear surface of the wiring substrate. The main surface of the wiring substrate has uncovered regions that are not covered with the lid at at least two corners that face each other.

According to the embodiment, after the semiconductor chip and the covering member such as the lid have been arranged on the first surface of the wiring substrate, the uncovered regions of the wiring substrate can be retained by the retention jig in retaining the first surface side of the wiring substrate to the retention jig. Therefore, a precision in the position of the wiring substrate relative to the retention jig is enhanced.

BRIEF DESCRIPTION OF THE DRAWINGS

FIGS. 28A and 28B are diagrams illustrating the method of manufacturing the semiconductor device according to the modification 3;

FIGS. 29A and 29B are diagrams illustrating the method of manufacturing the semiconductor device according to the modification 3;

DETAILED DESCRIPTION

Hereinafter, embodiments will be described with reference to the accompanying drawings. In all of the drawings, the same components are denoted by identical symbols, and a description thereof will be appropriately omitted.

Embodiments

Figure 1:
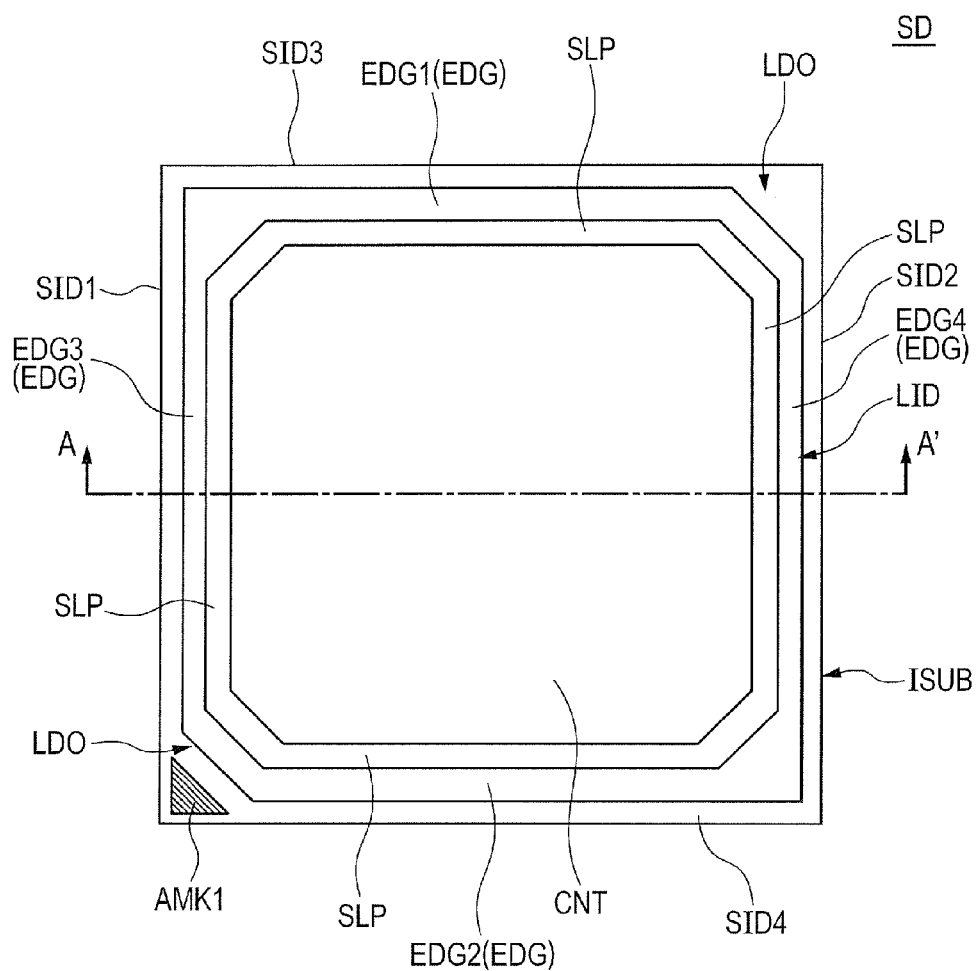
FIG. 1 is a plan view illustrating a configuration of a semiconductor device according to an embodiment.
Figure 2:
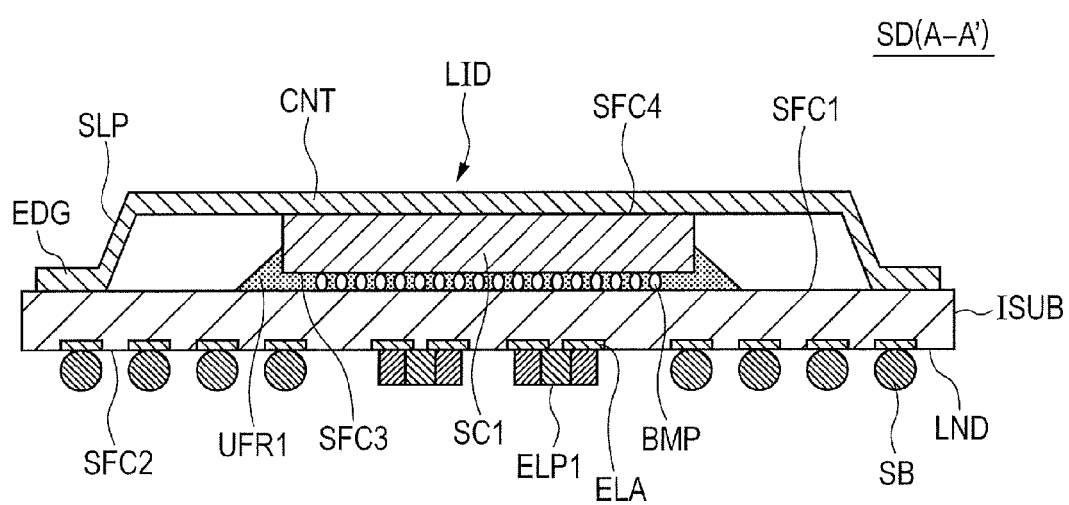
FIG. 2 is a cross-sectional view taken along a line A-A' in FIG. 1.

FIG. 1 is a plan view illustrating a configuration of a semiconductor device SD according to an embodiment. FIG. 2 is a cross-sectional view taken along a line A-A' in FIG. 1. In FIG. 2, for facilitating visualization of the drawings, the number of external connection terminals SB and the number of electronic components ELP1 are reduced.

The semiconductor device SD according to this embodiment includes a first semiconductor chip SC1, a wiring substrate ISUB, a lid LID (covering member), and the electronic components ELP1. A rear surface SFC4 of the first semiconductor chip SC1 is an opposite surface of a main surface SFC3 thereof. The wiring substrate ISUB is rectangular, and includes a main surface SFC1 (second main surface) and a rear surface SFC2 (second rear surface). The first semiconductor chip SC1 is mounted on the main surface SFC1. The lid LID covers the main surface SFC1 of the wiring substrate ISUB, and the first semiconductor chip SC1. The electronic components ELP1 are mounted on the rear surface SFC2 of the wiring substrate ISUB. The main surface SFC1 of the wiring substrate ISUB has uncovered regions LDO not covered with the lid LID at least two corners facing each other. In other words, at at least two corners facing each other in the main surface SFC1, widths of portions not covered with the lid LID are wider than other portions of edges of the main surface SFC1. Hereinafter, the configuration will be described in detail.

As illustrated in FIG. 2, the first semiconductor chip SC1 is mounted on the wiring substrate ISUB in a flip chip manner. The first semiconductor chip SC1 is configured by, for example, a logic chip, but may be configured by a memory chip, a chip in which a logic chip and a memory circuit are mixed together, or a power chip that controls an electric power.

A plurality of electrode pads EL (to be described later with reference to FIG. 7) are formed on the main surface SFC3 of the first semiconductor chip SC1. The first semiconductor chip SC1 is mounted on the main surface SFC1 in such a direction that the main surface SFC3 faces the main surface SFC1 of the wiring substrate ISUB. The electrode pads EL are connected to terminals (not shown) formed on the main surface SFC1 of the wiring substrate ISUB through terminals BMP (for example, solder bumps, or conductor columns such as Cu columns or Au columns). A space formed between the main surface SFC3 of the first semiconductor chip SC1 and the main surface SFC1 of the wiring substrate ISUB is sealed by an underfill resin UFR1. A part of the underfill resin UFR1 creeps along sides of the first semiconductor chip SC1 to form a fillet.

The rear surface SFC4 of the first semiconductor chip SC1 is fixed to the lid LID through an adhesion layer. It is preferable that the adhesion layer is high in thermal conductivity.

The lid LID is formed by drawing a plate made of metal such as Cu. As a result, the lid LID is shaped so that a center portion CNT that contacts with the first semiconductor chip SC1, and an edge EDG are connected to each other through a slope portion SLP. The slope portion SLP is sloped to be closer to the wiring substrate ISUB as the slope portion SLP is farther from the center portion CNT. An inclination angle of the slope portion SLP to the center portion CNT may be nearly perpendicular. The edge EDG of the lid LID comes in contact with a region of the wiring substrate ISUB which is located outside of the underfill resin UFR1. At least a part of the edge EDG of the lid LID is fixed to the wiring substrate ISUB through the adhesion layer.

As illustrated in FIG. 1, a planar shape of the lid LID is notched at two corners of a rectangle which face each other. Four corners of the lid LID overlap with respective four corners of the wiring substrate ISUB. The uncoated regions LDO of the wiring substrate ISUB are positioned at portions of the lid LID in which the corners are notched. A width of the portions of the uncoated regions LDO which overlap with the diagonal line of the wiring substrate ISUB is, for example, equal to or larger than 1 mm, and equal to or smaller than 6 mm.

The slope portion SLP of the lid LID is formed along an outline in which four corners of a rectangle are notched. In other words, the slope portion SLP is formed along the respective sides of an octagon. In the octagon, respective two sides that face each other are parallel to each other, and four sides facing the four corners of the wiring substrate ISUB are each shorter than four sides facing the four sides of the wiring substrate ISUB.

As illustrated in FIG. 2, the wiring substrate ISUB is formed of, for example, a resin interposer, and has a plurality of electrodes LND (first rear electrodes) on the rear surface SFC2. The plurality of electrodes LND are connected to the terminals BMP through through-holes (not shown) or lines (not shown) within the wiring substrate ISUB. A part of the plurality of electrodes LND may be connected to electronic components ELP through lines within the wiring substrate ISUB. The electrodes LND are provided with the external connection terminals SB. The external connection terminals SB are configured by, for example, solder balls.

The electronic components ELP are mounted on the rear surface SFC2 of the wiring substrate ISUB. The electronic components ELP are configured by, for example, discrete components such as a capacitor, a resistor, or an inductor, but may be configured by a chip configuring a circuit. The electronic components ELP are connected to terminals ELA disposed on the rear surface SFC2.

Also, as illustrated in FIG. 1, the main surface SFC1 of the wiring substrate ISUB is provided with an alignment mark AMK1. The alignment mark AMK1 is a pattern made of the same conductor (for example, Cu) as that of lines formed on the main surface SFC1, and used as a positioning pattern when the first semiconductor chip SC1 and the lid LID are mounted on the main surface SFC1. The alignment mark AMK1 is located in any uncoated region LDO of the main surface SFC1.

Figure 3:
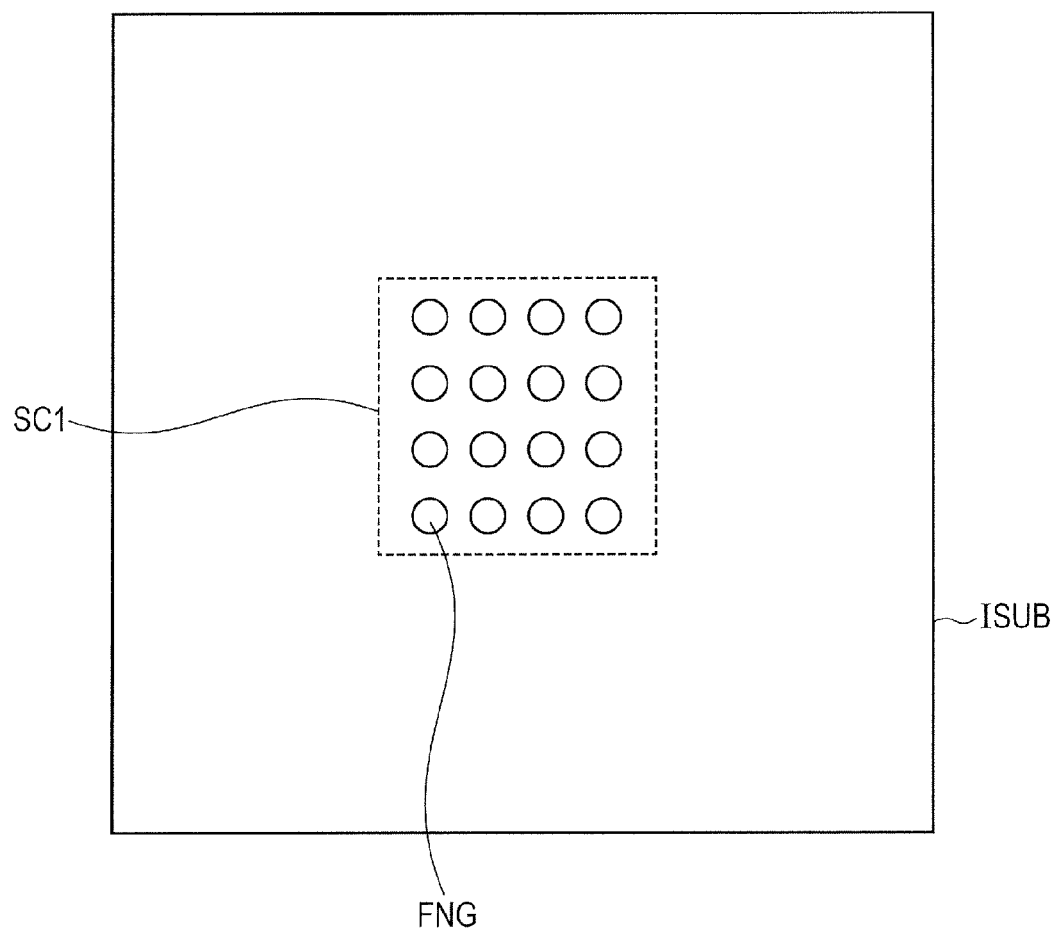
FIG. 3 is a diagram illustrating a configuration of a main surface of a wiring substrate.

FIG. 3 is a diagram illustrating a configuration of the main surface SFC1 of the wiring substrate ISUB. A plurality of electrodes FNG (second electrodes) are formed in a region where the first semiconductor chip SC1 is to be arranged on the main surface SFC1. The respective electrodes FNG are connected to the electrode pads EL of the first semiconductor chip SC1 through the terminals BMP.

Figure 4:
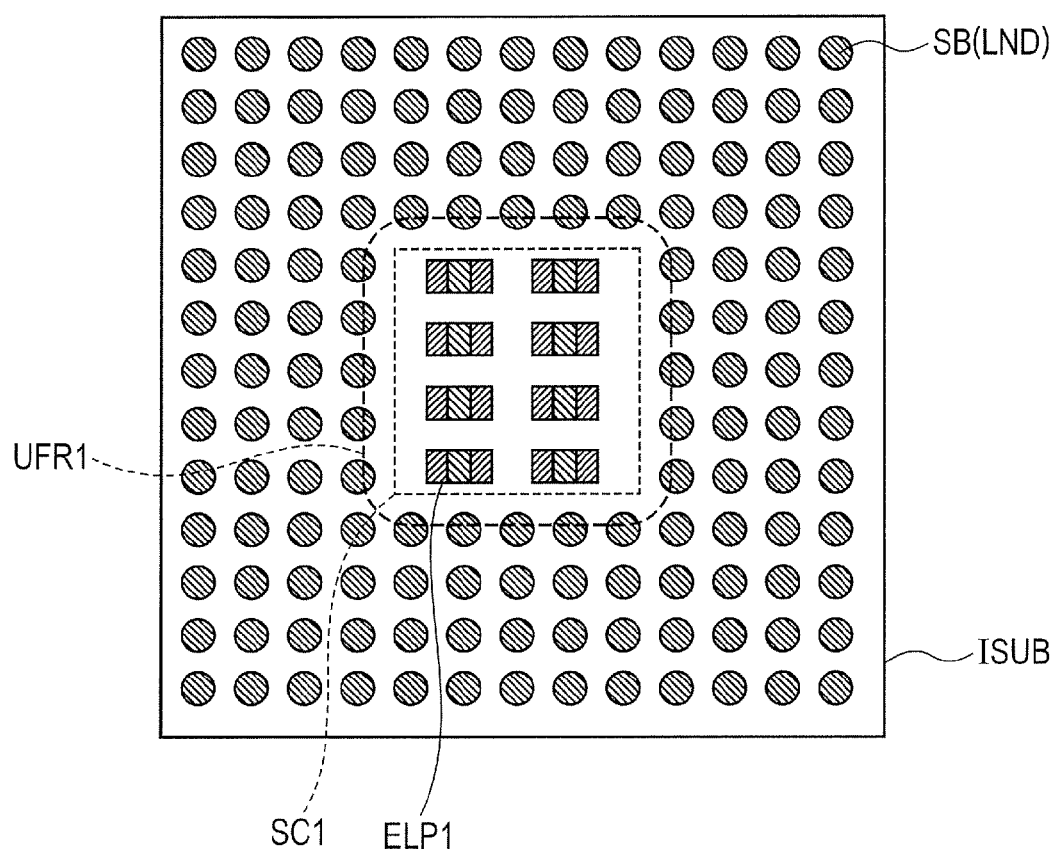
FIG. 4 is a diagram illustrating a first example of a rear surface of the semiconductor device.

FIG. 4 is a diagram illustrating a first example of a rear surface of the semiconductor device SD. In the example illustrated in this drawing, the plurality of external connection terminals SB and the plurality of electrodes LND are arranged in a region of the rear surface SFC2 except for a portion that overlaps with the first semiconductor chip SC1, two-dimensionally, in other words, on lattice points. A plurality of the electronic components ELP1 are mounted on a portion of the rear surface SFC2 where the electrodes LND and the external connection terminals SB are not formed, that is, a portion that overlaps with the first semiconductor chip SC1. The electronic components ELP1 are connected to the first semiconductor chip SC1 through the through-holes and the lines of the wiring substrate ISUB. With this arrangement, an inductance of a connection route that connects the first semiconductor chip SC1 and the electronic components ELP1 can be reduced. The electronic components ELP1 are configured by, for example, power enhancement capacitors.

Figure 5:
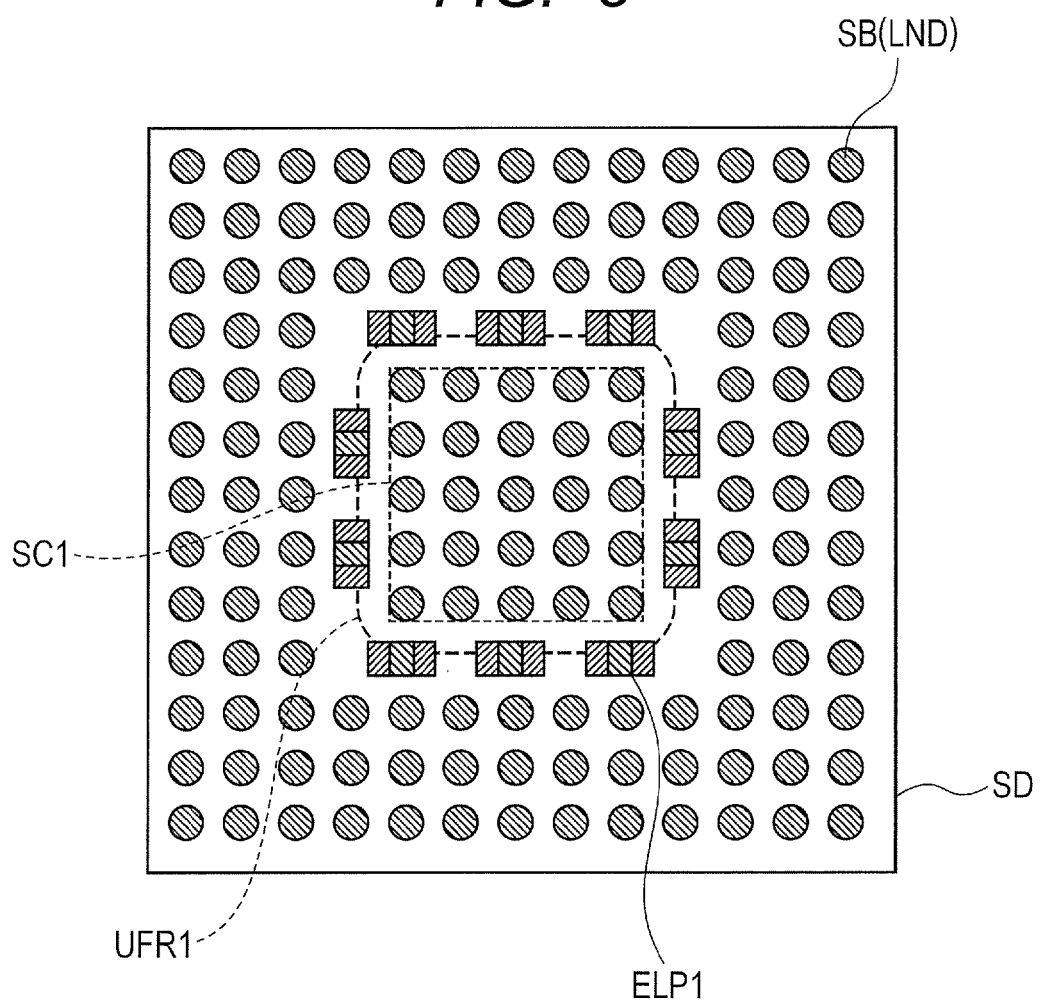
FIG. 5 is a diagram illustrating a second example of the rear surface of the semiconductor device.

FIG. 5 is a diagram illustrating a second example of the rear surface of the semiconductor device SD. The example illustrated in this drawing is identical with the example illustrated in FIG. 4 except for the following configurations. First, the electrodes LND and the external connection terminals SB are also formed under a portion of the rear surface SFC2 which overlaps with the first semiconductor chip SC1. The electronic components ELP1 are arranged in the vicinity of an edge of the first semiconductor chip SC1. With this arrangement, as compared with the example illustrated in FIG. 4, the number of external connection terminals SB can be increased. Also, an inductance of a connection route that connects the first semiconductor chip SC1 and the electronic components ELP1 can be suppressed.

In each of FIGS. 4 and 5, at least a part of the electrodes LND and the external connection terminals SB may be omitted. Also, at least a part of the electrodes LND of the rear surface SFC2 is used as a positioning mark when the electronic components ELP1 are mounted on the rear surface SFC2. The electrode LND is located, for example, at a corner of the rear surface SFC2.

Figure 6:
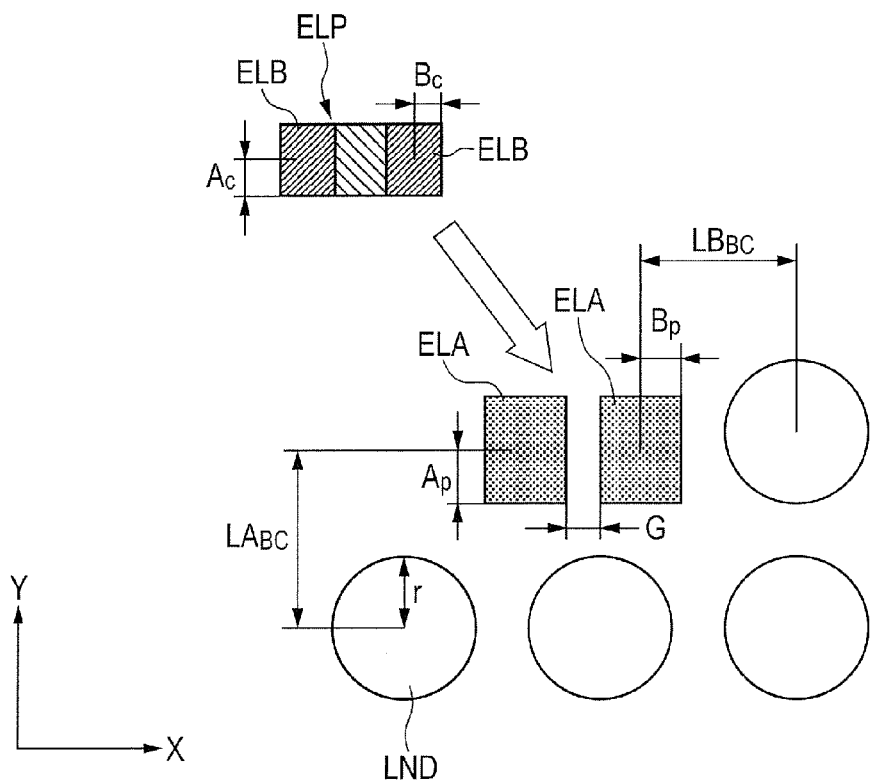
FIG. 6 is a diagram illustrating a distance between a terminal connected to an electronic component and an electrode.

FIG. 6 is a diagram illustrating a distance between the terminals ELA connected to the electronic components ELP and the electrodes LND. The electronic components ELP each have two terminals ELB. In correspondence with those terminals ELB, two terminals ELA are formed on the rear surface SFC2 for one electronic component ELP. It is assumed that a distance between a center of one terminal ELA and a center of the electrodes LND aligned in a first direction (X-direction in the figure) is $LB_{BC}$, and a distance between a center of the other terminal ELA and a center of the electrodes LND aligned in a second direction (Y-direction in the figure) is $LA_{BC}$. Also, it is assumed that a radius of the electrodes LND is r, a half width of the terminals ELA in the first direction (X-direction in the figure) is $B_p$, and a half width of the terminals ELA in the second direction (Y-direction in the figure) is $A_p$. Also, it is assumed that a half width of the terminals ELB in the first direction (X-direction in the figure) is $B_c$, and a half width of the terminals ELB in the second direction (Y-direction in the figure) is $A_c$. Also, it is assumed that an interval between the two terminals ELA is G. Then, Expression (1), (2), or (3) described below is satisfied. Any one of Expressions (2) and (3) larger on a right side is selected.

$$LA_{BC} > r + A_c + A_p \quad (1)$$

$$LB_{BC} > r + B_c + B_p \quad (2)$$

$$LB_{BC} > r + G + B_p \quad (3)$$

In the example illustrated in FIG. 6, the electronic components ELP include two kinds of electronic components ELP1 and ELP2. The planar shapes of the electronic components ELP1 and ELP2 are each rectangular. The terminals ELB of the electronic components ELP1 are formed along the two long sides of the rectangle, and the terminals ELB of the electronic components ELP2 are formed along the two short sides of the rectangle.

Figure 7:
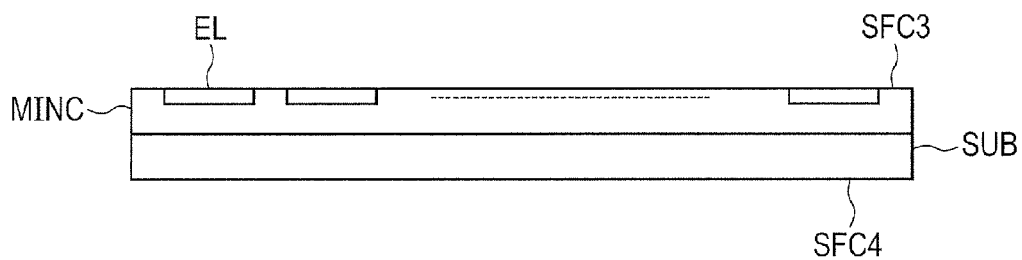
FIG. 7 is a cross-sectional view illustrating a configuration of a first semiconductor chip.

FIG. 7 is a cross-sectional view illustrating a configuration of the first semiconductor chip SC1. The first semiconductor chip SC1 has a configuration in which a multilayer wiring layer MINC is stacked on a substrate SUB. The substrate SUB is formed of, for example, a silicon substrate. A plurality of semiconductor elements, for example, transistors are formed on the substrate SUB. The electrode pads EL are formed on an uppermost wiring layer of the multilayer wiring layer MINC. The electrode pads EL are connected to the electrodes FNG of the wiring substrate ISUB illustrated in FIG. 3 through the terminals BMP illustrated in FIG. 2.

FIGS. 8A to 8C and 9A, 9B are cross-sectional views illustrating a method of manufacturing the semiconductor device SD. Before those processes illustrated in those drawings, the first semiconductor chip SC1 is prepared. The first semiconductor chip SC1 is formed, for example, as follows.

First, an element isolation film is formed on the substrate SUB. An element formation region is isolated by the element isolation film. The element isolation film is formed through, for example, an STI technique, but may be formed through a LOCOS technique. Then, a gate insulating film and a gate electrode are formed on the substrate SUB located in the element formation region. The gate insulating film may be formed of a silicon oxide film, or may be formed of a high dielectric constant film (for example, hafnium silicon film) higher in dielectric constant than the silicon oxide film. When the gate insulating film is formed of the silicon oxide film, the gate electrode is formed of a polysilicon film. Also, when the gate insulating film is a high dielectric constant film, the gate electrode is formed of a laminated film of a metal film (for example, TiN) and a polysilicon film. Also, when the gate electrode is made of polysilicon, a polysilicon resistor may be formed on the element isolation film in a process of forming the gate electrode.

Subsequently, extension regions of the source and the drain are formed on the substrate SUB located in the element formation region. Then, a sidewall is formed on a side wall of the gate electrode. Then, impurity regions that form the source and the drain are formed on the substrate SUB located in the element formation region. In this way, a MOS transistor is formed on the substrate SUB.

Then, the multilayer wiring layer MINC is formed on the element isolation film and the MOS transistor. The electrode pads EL are formed on the uppermost wiring layer. Then, a protective insulating film (passivation film) is formed on the multilayer wiring layer MINC. Openings located on the EL are formed in the protective insulating film. Then, the terminals BMP are formed on the electrode pads EL.

Figure 8A:
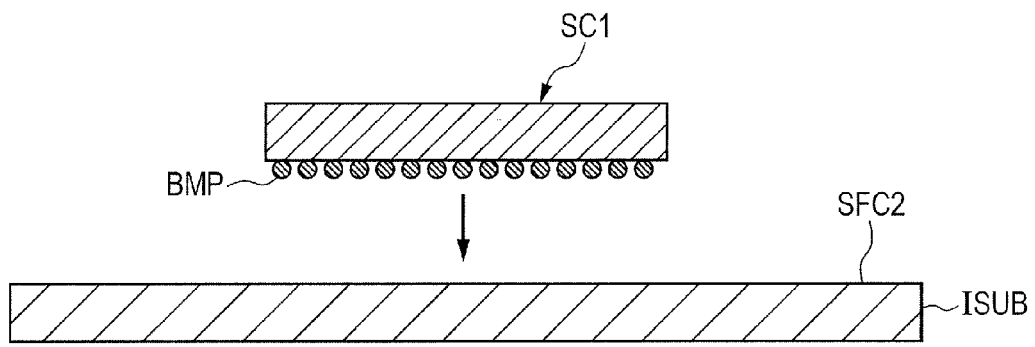
FIGS. 8A to 8C are cross-sectional views illustrating a method of manufacturing the semiconductor device.
Figure 8B:
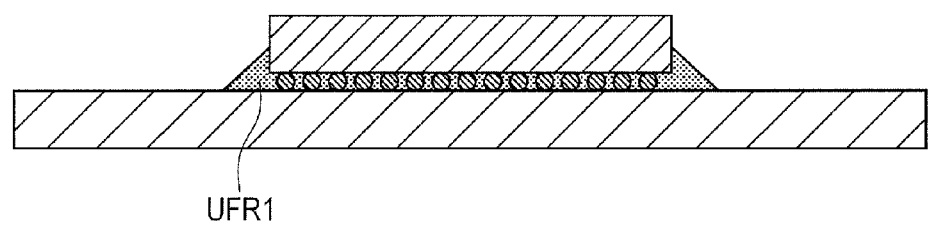

Then, as illustrated in FIG. 8A, the first semiconductor chip SC1 is mounted on the main surface SFC1 of the wiring substrate ISUB. Then, as illustrated in FIG. 8B, the underfill resin UFR1 is allowed to flow into a space formed between the main surface SFC1 and the first semiconductor chip SC1. The underfill resin UFR1 may be formed of an NCF (nonconductive film). In this case, the NCF is formed on the main surface SFC1 before the first semiconductor chip SC1 is mounted on the main surface SFC1.

Figure 8C:
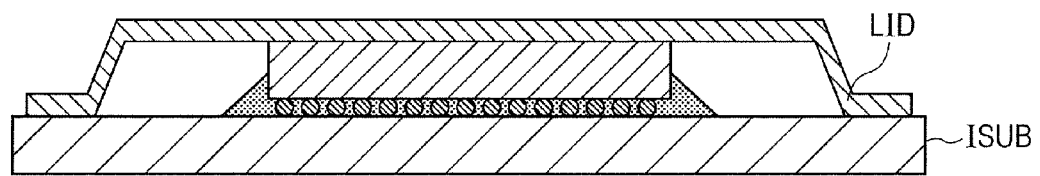

Then, as illustrated in FIG. 8C, the lid LID is fixed onto the rear surface SFC4 of the first semiconductor chip SC1 and the main surface SFC1 of the wiring substrate ISUB.

In the processes illustrated in FIGS. 8A to 8C, the alignment mark AMK1 is used to determine the orientations of the first semiconductor chip SC1 and the lid LID relative to the wiring substrate ISUB. The positioning of the first semiconductor chip SC1 and the lid LID relative to the wiring substrate ISUB is conducted on the basis of another alignment mark formed on the main surface SFC1 of the wiring substrate ISUB.

Figure 9A:
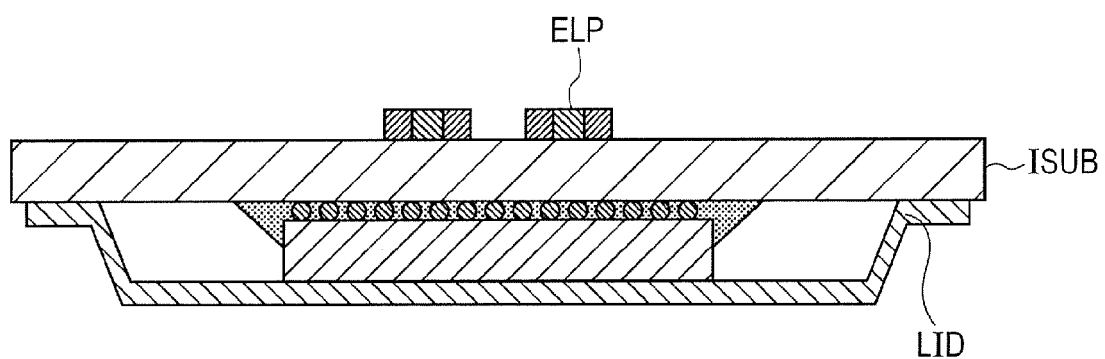
FIGS. 9A and 9B are cross-sectional views illustrating the method of manufacturing the semiconductor device.
Figure 9B:
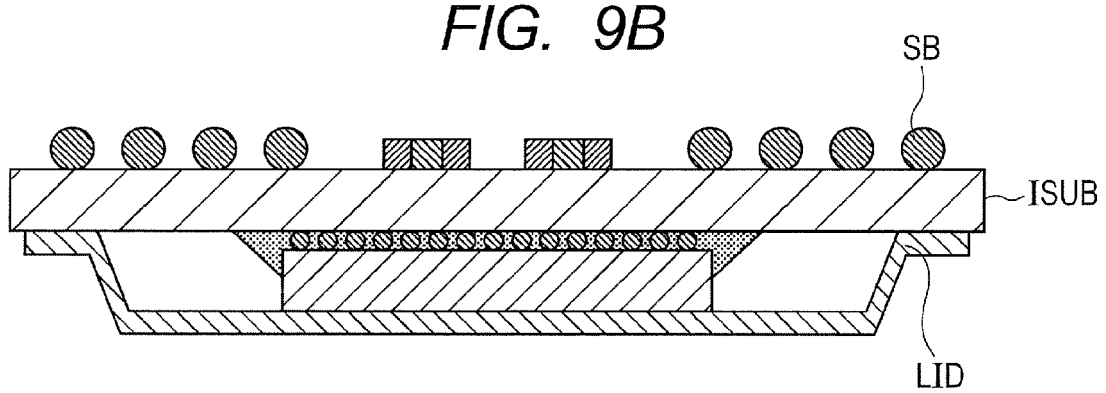

Then, as illustrated in FIG. 9A, the rear surface SFC2 of the wiring substrate ISUB is turned upward. Then, the electronic components ELP are mounted on the rear surface SFC2. Thereafter, as illustrated in FIG. 9B, the external connection terminals SB are mounted on the electrodes LND of the rear surface SFC2.

Figure 10:
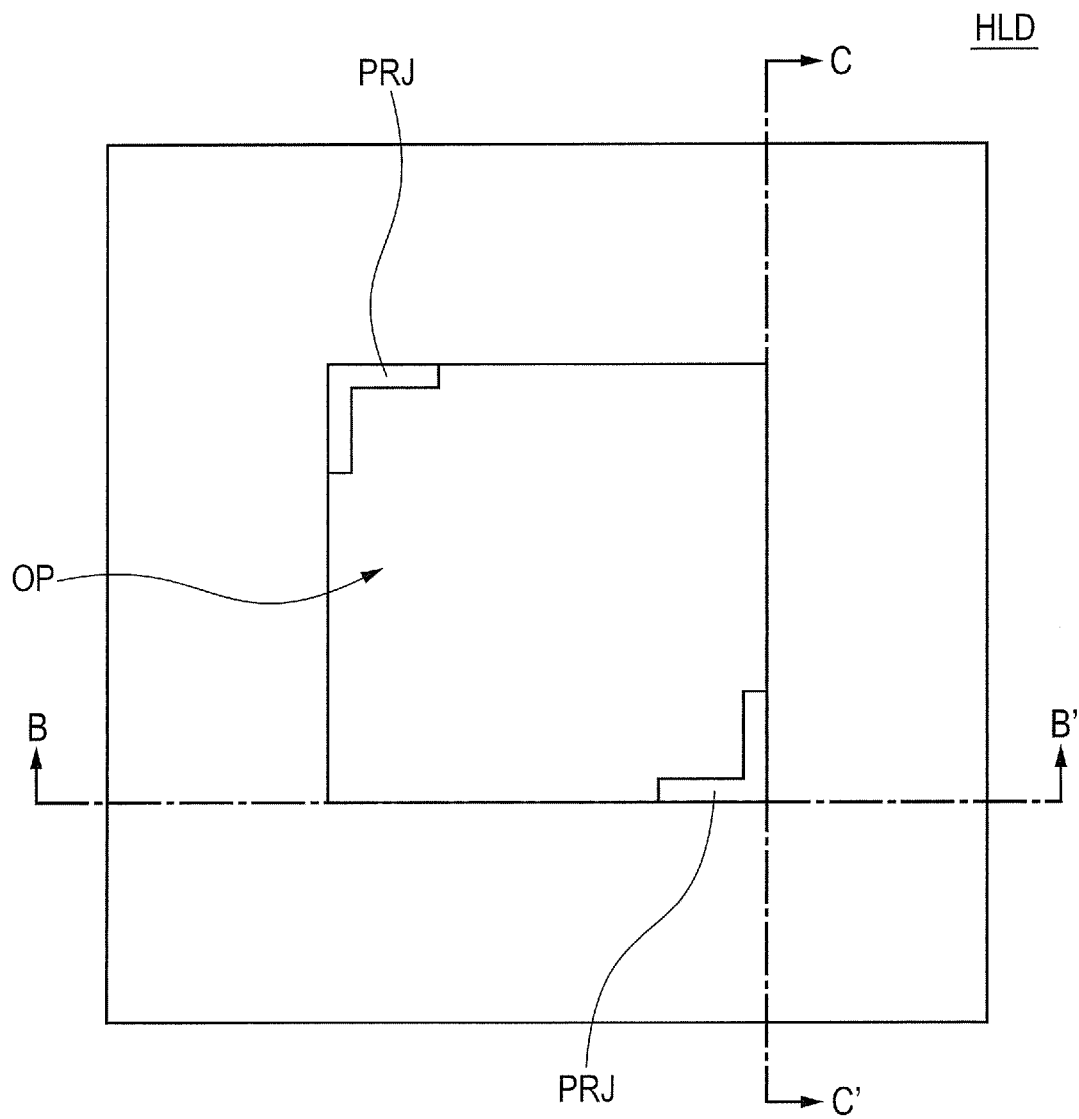
FIG. 10 is a plan view illustrating a configuration of a retention jig.
Figure 11:
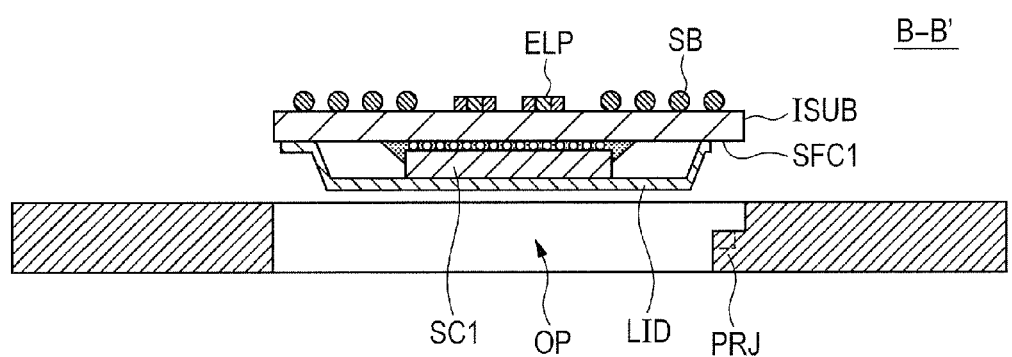
FIG. 11 is a cross-sectional view taken along a line B-B' in FIG. 10.
Figure 12:
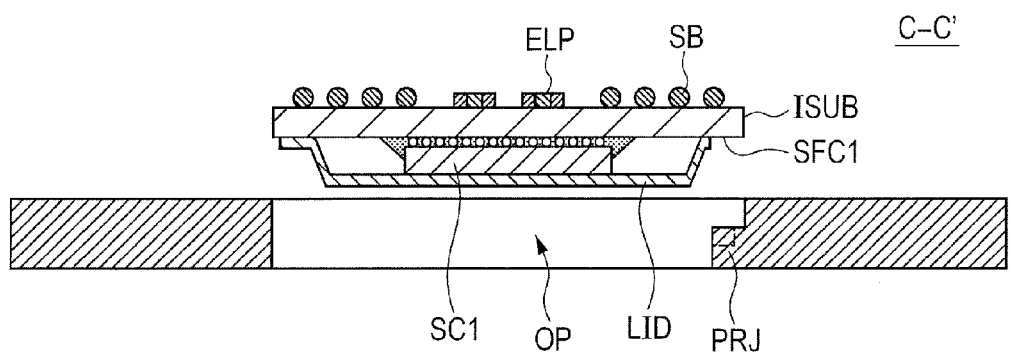
FIG. 12 is a cross-sectional view taken along a line C-C' in FIG. 10.

FIG. 10 is a plan view illustrating a configuration of a retention jig HLD used when the electronic components ELP and the external connection terminals SB are mounted on the rear surface SFC2. FIG. 11 is a cross-sectional view taken along a line B-B' in FIG. 10, and FIG. 12 is a cross-sectional view taken along a line C-C' of FIG. 10.

The retention jig HLD is formed of a plate member, and has an opening OP in a center portion thereof. A planar shape of the opening OP is substantially rectangular, and substantially identical in size with the planar shape of the wiring substrate ISUB. That is, the wiring substrate ISUB is fitted into the opening OP. Two corners facing each other in four corners of the opening OP are each formed with a support portion PRJ. Each of the support portions PRJ is shaped to project from an inner surface of the opening OP toward an inside of the opening OP. A surface of the support portion PRJ on which the wiring substrate ISUB is fitted is lower in height than a main body of the retention jig HLD. In the example illustrated in this figure, the support portions PRJ are each formed along two side surfaces configuring the corner of the opening OP.

Then, the wiring substrate ISUB to which the first semiconductor chip SC1 and the lid LID have been attached is fitted into the retention jig HLD in such a direction that the main surface SFC1 faces the retention jig HLD. In this situation, the uncovered regions LDO of the wiring substrate ISUB are configured to face the support portions PRJ. With the above configuration, upper surfaces of the support portions PRJ are abutted against the uncovered regions LDO of the wiring substrate ISUB, and positioned by the support portions PRJ of the wiring substrate ISUB.

Figure 13:
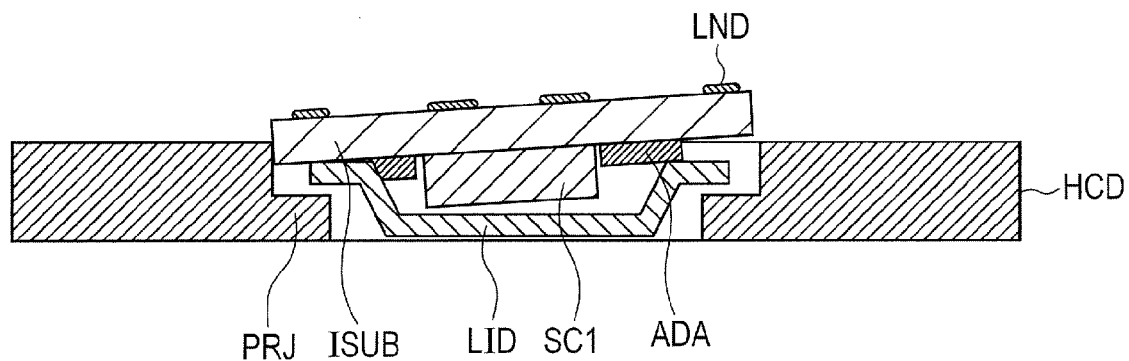
FIG. 13 is a diagram illustrating advantages obtained by the provision of an uncovered region on the wiring substrate.

Subsequently, the advantages obtained by the provision of the uncovered regions LDO on the wiring substrate ISUB will be described using FIGS. 13 and 14.

The lid LID is fixed to the wiring substrate ISUB with the use of an adhesion layer ADA, but a thickness of the adhesion layer ADA is likely to be varied. For that reason, the lid LID may be inclined with respect to the wiring substrate ISUB.

If the uncovered regions LDO are not provided on the wiring substrate ISUB, a substantially overall surface of the wiring substrate ISUB is covered with the lid LID. For that reason, as illustrated in FIG. 13, the support portions PRJ of the retention jig HLD support the edge EDG of the lid LID. In this example, when the lid LID is inclined with respect to the substrate SUB, the rear surface SFC2 is also included in a state where the wiring substrate ISUB is held by the retention jig HLD.

When the rear surface SFC2 is inclined, there is a concern that the electrode LND located adjacent to the electrode LND to be used as the alignment mark is falsely recognized as the alignment mark. In this case, there is a concern that the electronic components ELP are mounted on an incorrect place.

Also, when a flux is coated on the wiring substrate ISUB through a screen printing technique before the external connection terminals SB are formed thereon, if the rear surface SFC2 is inclined, the screen mask may be deformed, or the amount of coating of flux may become uneven.

Figure 14:
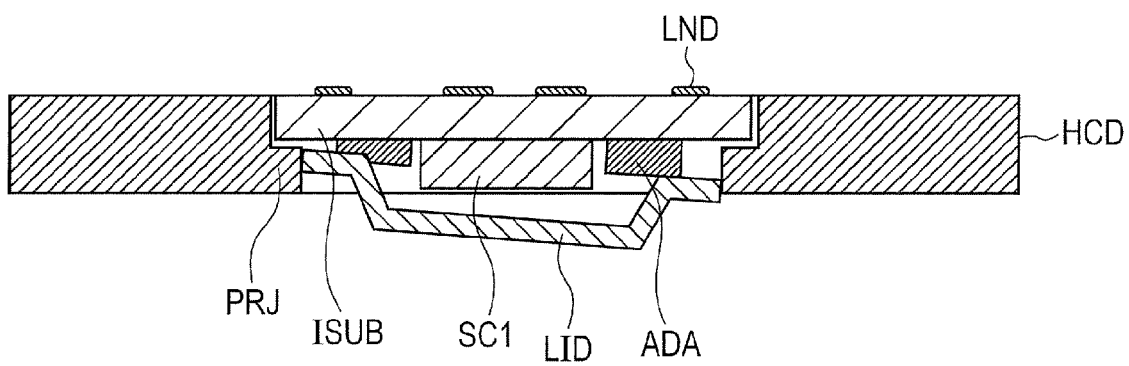
FIG. 14 is a diagram illustrating advantages obtained by the provision of the uncovered region on the wiring substrate.

On the contrary, in this embodiment, as illustrated in FIG. 14, because the upper surfaces of the support portions PRJ of the retention jig HLD are abutted against the uncovered regions LDO of the wiring substrate ISUB, the wiring substrate ISUB are positioned by the support portions PRJ. Therefore, even if the lid LID is inclined with respect to the wiring substrate ISUB, the rear surface SFC2 of the wiring substrate ISUB is situated at a given angle (for example, parallel) to the retention jig HLD. Therefore, the drawbacks described with reference to FIG. 13 are difficult to generate.

Modification 1

Figure 15:
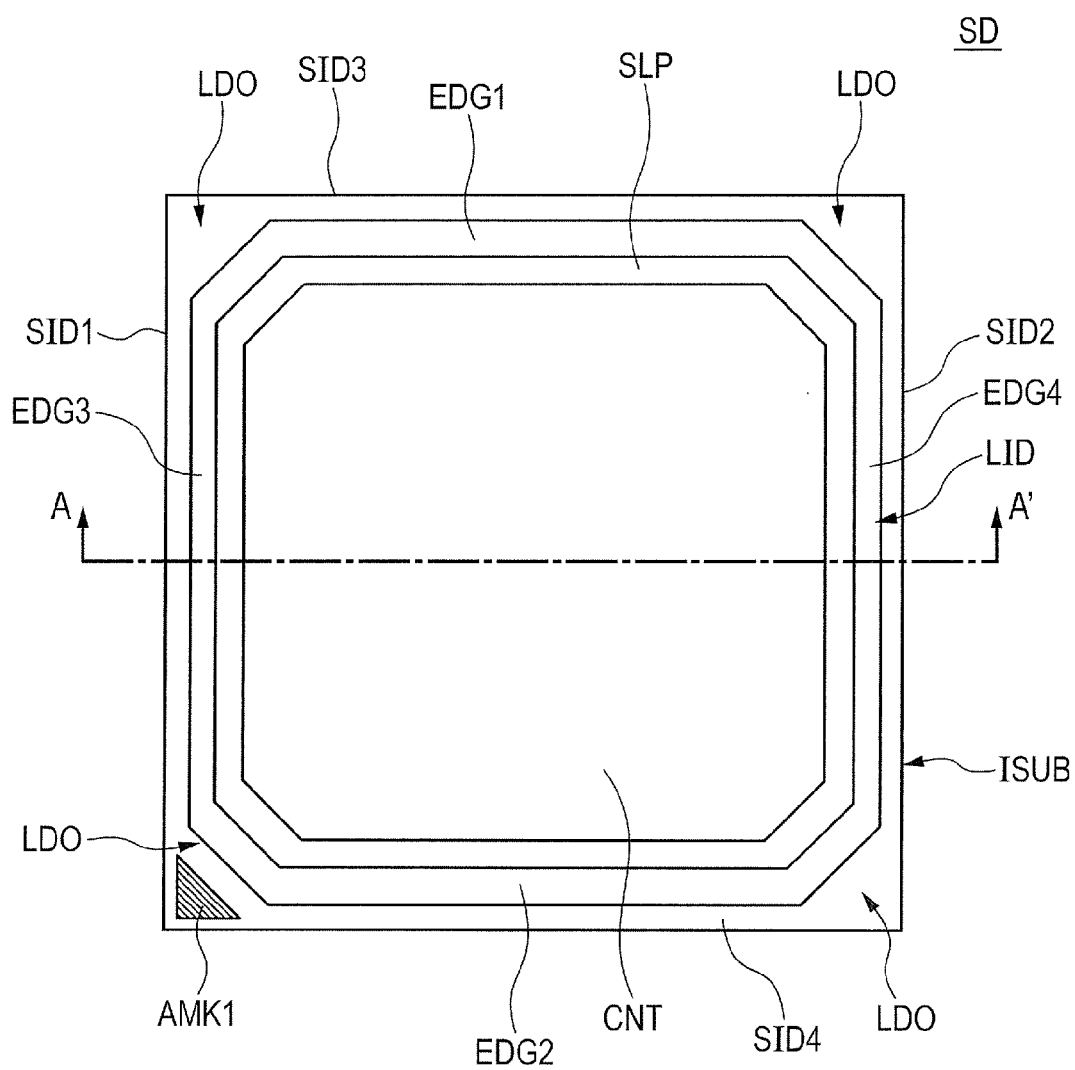
FIG. 15 is a plan view illustrating a configuration of a semiconductor device according to a modification 1.
Figure 16:
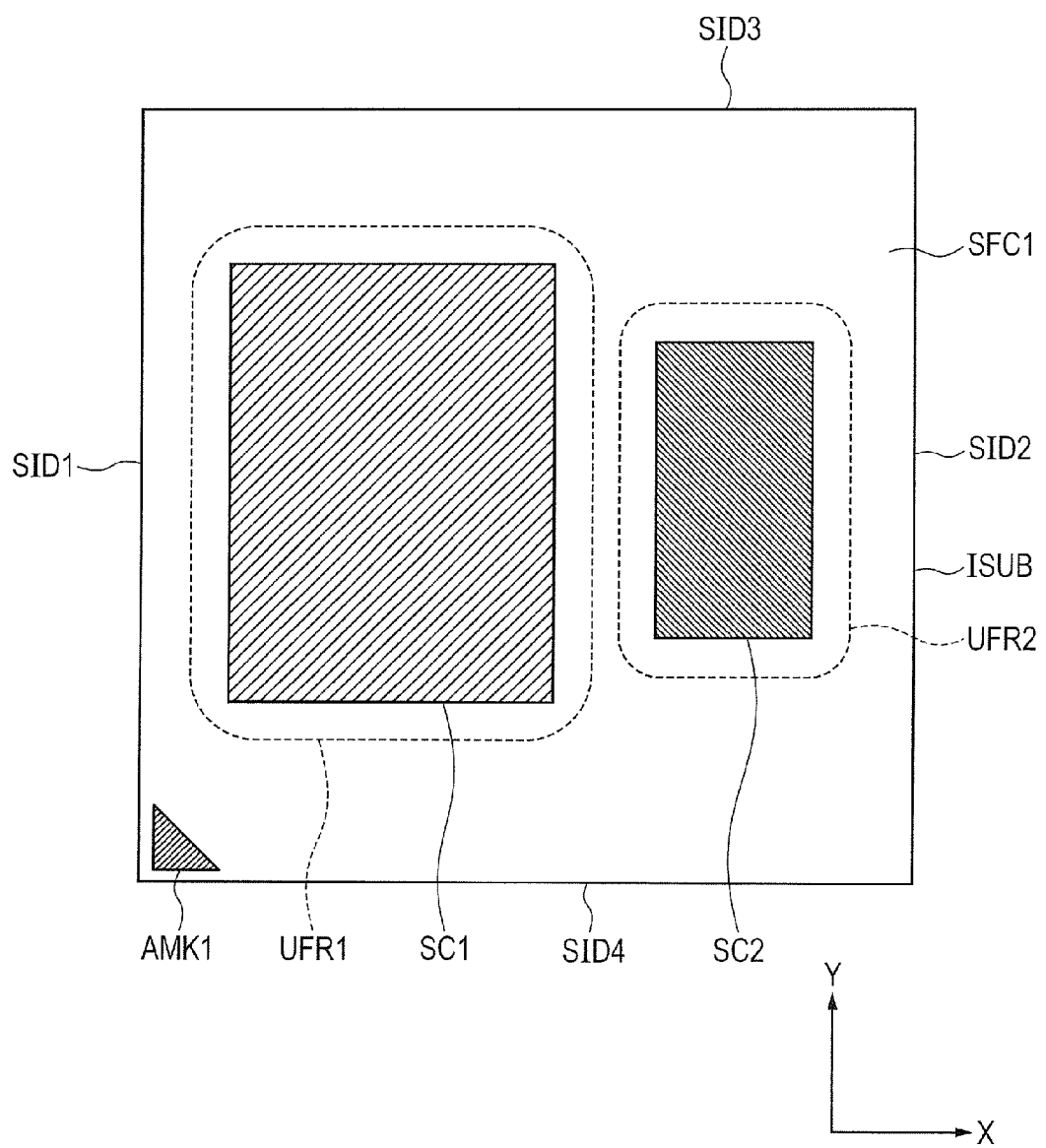
FIG. 16 is a plan view illustrating a state in which the lid is removed from the semiconductor device illustrated in FIG. 15.

FIG. 15 is a plan view illustrating a configuration of a semiconductor device SD according to a modification 1. FIG. 16 is a plan view illustrating a state in which the lid is removed from the semiconductor device SD illustrated in FIG. 15. The semiconductor device according to this modification has the same configuration as that of the semiconductor device SD according to the embodiment except for the following configurations.

First, as illustrated in FIG. 15, all of the four corners of the lid LID are notched. The uncovered regions LDO are disposed for all of the four corners of the wiring substrate ISUB.

Also, as illustrated in FIG. 16, the first semiconductor chip SC1 as well as a second semiconductor chip SC2 is mounted on the main surface SFC1 of the wiring substrate ISUB. The second semiconductor chip SC2 has the same configuration as that of the first semiconductor chip SC1 illustrated in FIG. 8. Also, the electrode FNG (fourth electrode) for connection to the electrode pads EL (third electrodes) of the second semiconductor chip SC2 is formed in a region of the wiring substrate ISUB which faces the second semiconductor chip SC2. The second semiconductor chip SC2 is mounted on the main surface SFC1 in the flip-chip manner as with the first semiconductor chip SC1. A surface (fifth main surface) of the second semiconductor chip SC2 on which the electrode pads EL are formed is sealed by an underfill resin UFR2.

In the modification, the first semiconductor chip SC1 and the second semiconductor chip SC2 are each rectangular, and mounted on the main surface SFC1 in such a direction that the respective long sides are parallel to each other. For that reason, a stress is liable to be exerted on the wiring substrate ISUB in a direction warping in a direction (Y-direction in the figure) along the long sides of the first semiconductor chip SC1. In the example illustrated in the figure, the short sides of the first semiconductor chip SC1 are parallel to a third side SID3 and a fourth side SID4 of the wiring substrate ISUB, and the long sides of the first semiconductor chip SC1 are parallel to a first side SID1 and a second side SID2 of the wiring substrate ISUB.

On the contrary, in this modification, as illustrated in FIG. 15, widths of edges EDG1 and EDG2 which are regions parallel to the short sides of the first semiconductor chip SC1 are wider than widths of edges EDG3 and EDG4 which are regions parallel to the long sides of the first semiconductor chip SC1. The edges EDG1 and EDG2 of the lid LID are fixed to the main surface SFC1. However, the edges EDG3 and EDG4 merely come in contact with the main surface SFC1. In other words, the lid LID is fixed along the first side SID1 and the second side SID2 of the wiring substrate ISUB. However, the lid LID is not fixed to the third side SID3 and the fourth side SID4. With the above configuration, the warp of the wiring substrate ISUB can be suppressed by the lid LID.

Figure 17:
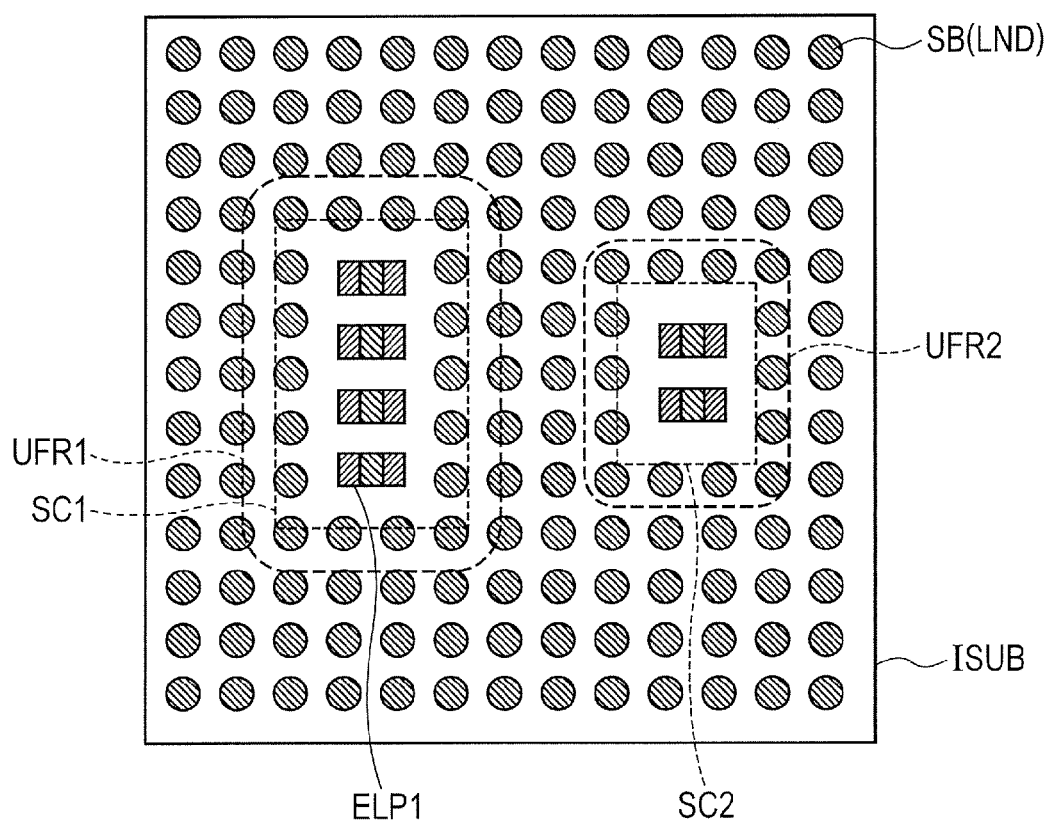
FIG. 17 is a diagram illustrating a first example of a rear surface of the wiring substrate.

FIG. 17 is a diagram illustrating a first example of the rear surface SFC2 of the wiring substrate ISUB in this modification. In the example illustrated in FIG. 17, the electronic components ELP are disposed in a region of the rear surface SFC2 which overlaps with the first semiconductor chip SC1, and a region of the rear surface SFC2 which overlaps with the second semiconductor chip SC2. The electronic components ELP located in the region that overlaps with the first semiconductor chip SC1 are electrically connected to the first semiconductor chip SC1. Also, the electronic components ELP located in the region that overlaps with the second semiconductor chip SC2 are electrically connected to the second semiconductor chip SC2.

Figure 18:
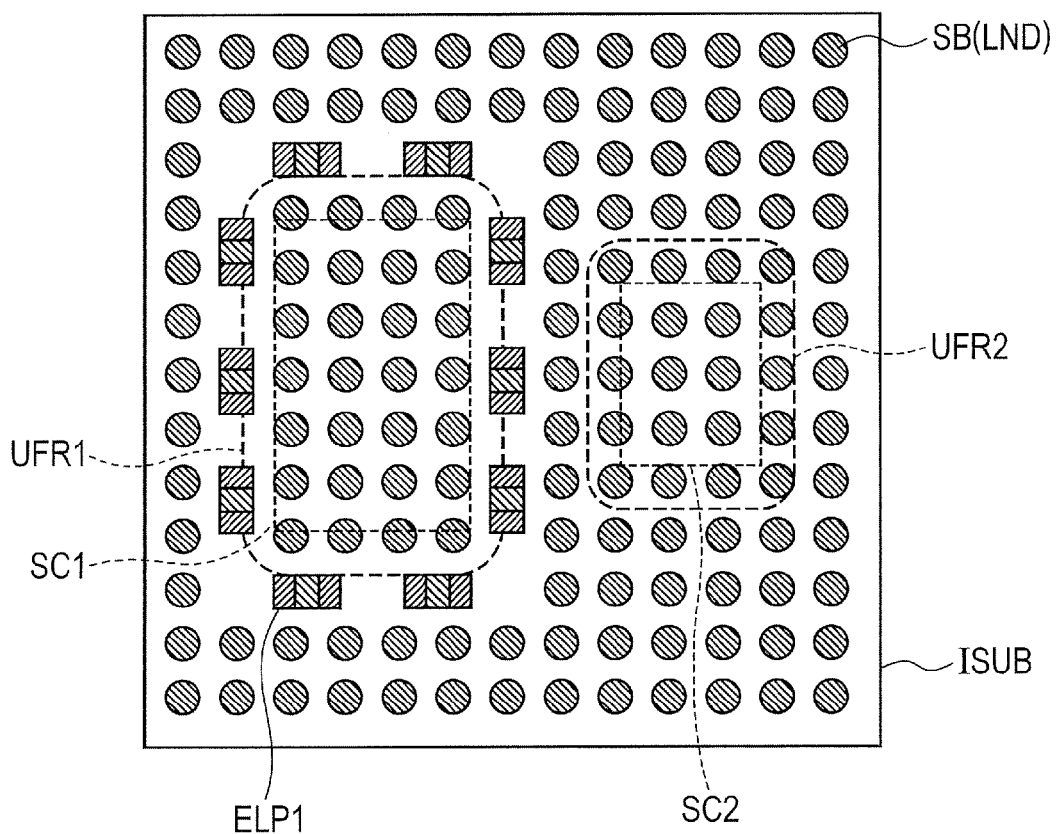
FIG. 18 is a diagram illustrating a second example of the rear surface of the wiring substrate.

FIG. 18 is a diagram illustrating a second example of the rear surface SFC2 of the wiring substrate ISUB in this modification. In the example illustrated in FIG. 18, the electronic components ELP are disposed at least around a region of the rear surface SFC2 which overlaps with the first semiconductor chip SC1, and around a region of the rear surface SFC2 which overlaps with the second semiconductor chip SC2. In the example illustrated in FIG. 18, the first semiconductor chip SC1 is larger than the second semiconductor chip SC2. The electronic components ELP are disposed around a region of the rear surface SFC2 which overlaps with the first semiconductor chip SC1. Those electronic components ELP are electrically connected to the first semiconductor chip SC1.

Figure 19:
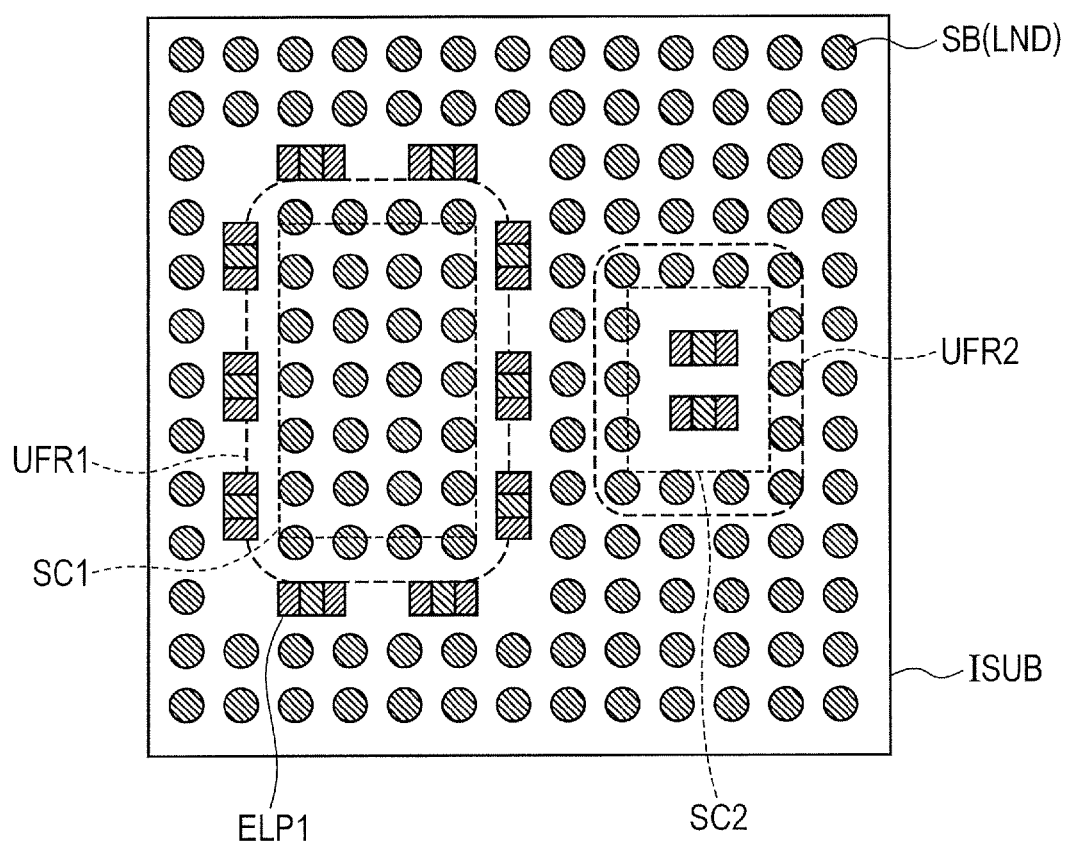
FIG. 19 is a diagram illustrating a third example of the rear surface of the wiring substrate.

FIG. 19 is a diagram illustrating a third example of the rear surface SFC2 of the wiring substrate ISUB in this modification. In the example illustrated in FIG. 19, the first semiconductor chip SC1 is larger than the second semiconductor chip SC2. The electronic components ELP are disposed around a region of the rear surface SFC2 which overlaps with the first semiconductor chip SC1, and in a region of the rear surface SFC2 which overlaps with the second semiconductor chip SC2. The electronic components ELP located around the region that overlaps with the first semiconductor chip SC1 are electrically connected to the first semiconductor chip SC1. The electronic components ELP located in the region that overlaps with the second semiconductor chip SC2 are electrically connected to the second semiconductor chip SC2.

A method of manufacturing the semiconductor device SD according to this modification is identical with the method of manufacturing the semiconductor device SD according to the embodiment except for the shape of the opening OP of the retention jig HLD.

Figure 20:
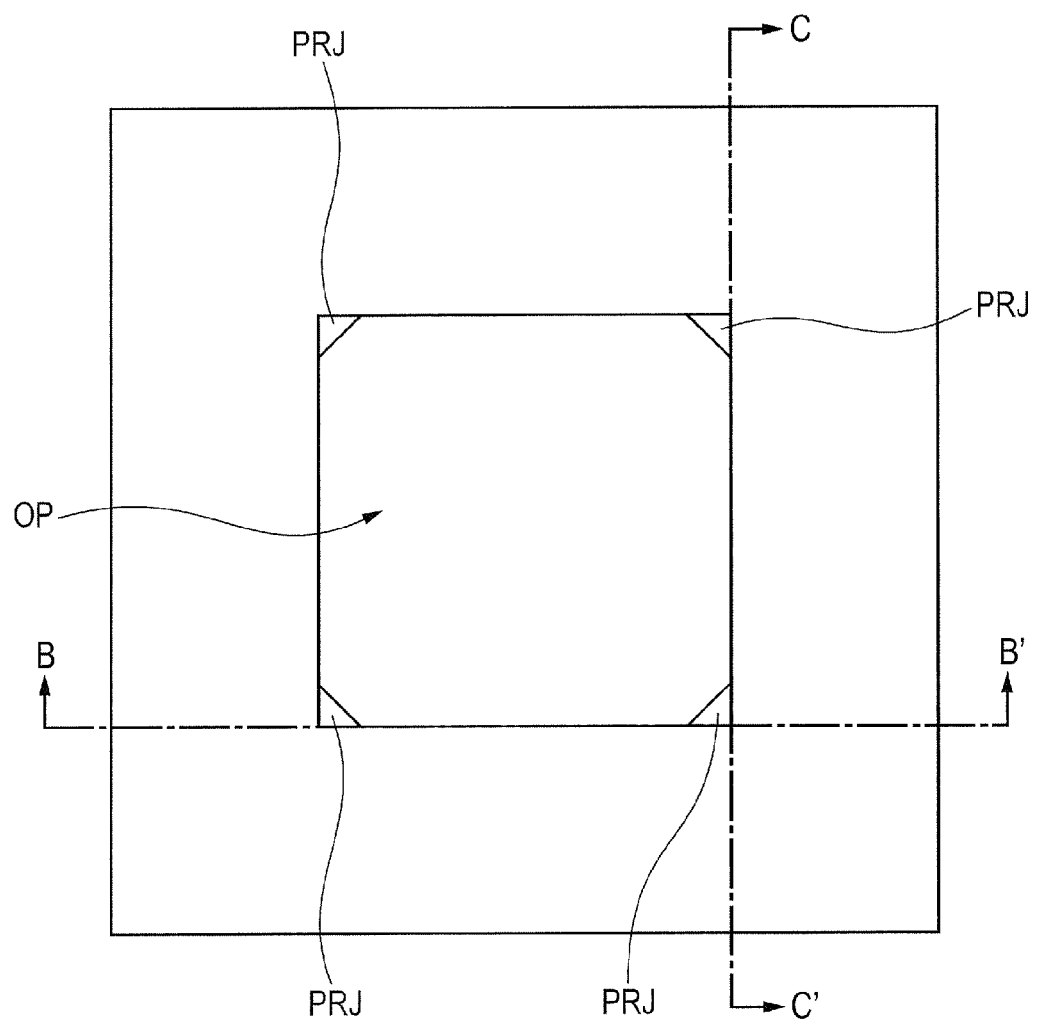
FIG. 20 is a plan view illustrating the retention jig.
Figure 21:
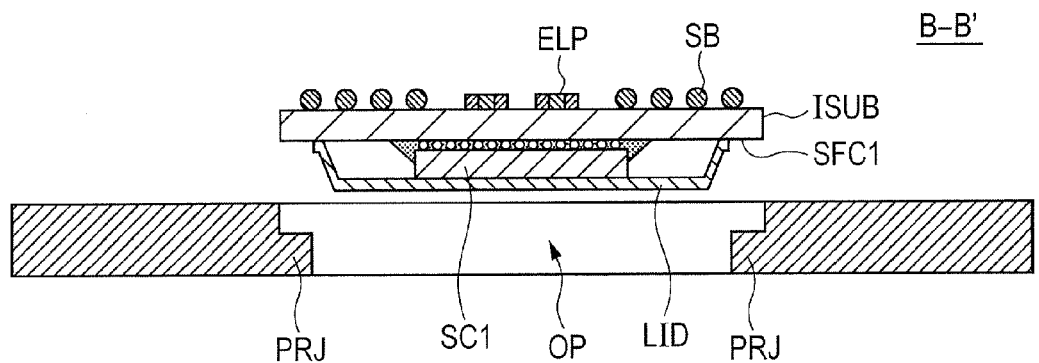
FIG. 21 is a cross-sectional view taken along a line B-B' in FIG. 20.
Figure 22:
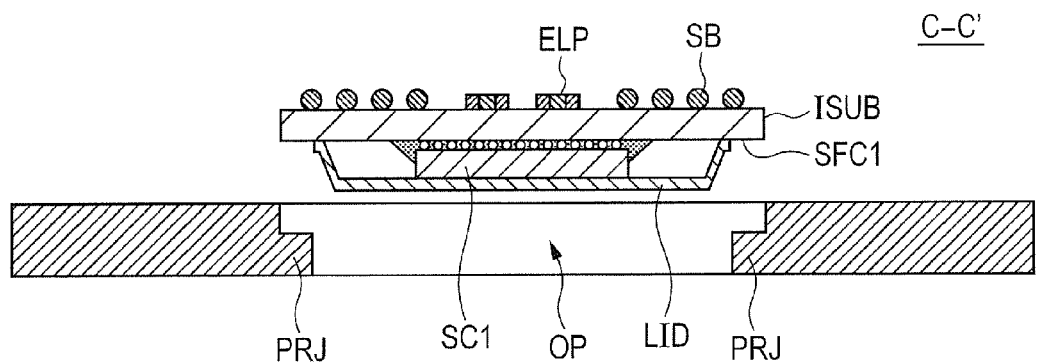
FIG. 22 is a cross-sectional view taken along a line C-C' in FIG. 20.

FIG. 20 is a plan view illustrating a configuration of the retention jig HLD used in this modification. FIG. 21 is a cross-sectional view taken along a line B-B' in FIG. 20. FIG. 22 is a cross-sectional view taken along a line C-C' in FIG. 20. The retention jig HLD illustrated in those figures is identical in configuration with the retention jig HLD shown in the embodiment except that the support portions PRJ are formed at the respective four corners of the opening OP.

This modification also obtains the same advantages as those in the embodiment. Also, the respective uncovered regions LDO are formed at all of the four corners of the wiring substrate ISUB. Also, in correspondence with this configuration, the respective support portions PRJ are formed at all of the four corners of the opening OP of the retention jig HLD. Therefore, when the wiring substrate ISUB is fitted into the opening OP, the wiring substrate ISUB can be prevented from moving relative to the retention jig HLD.

Modification 2

Figure 23:
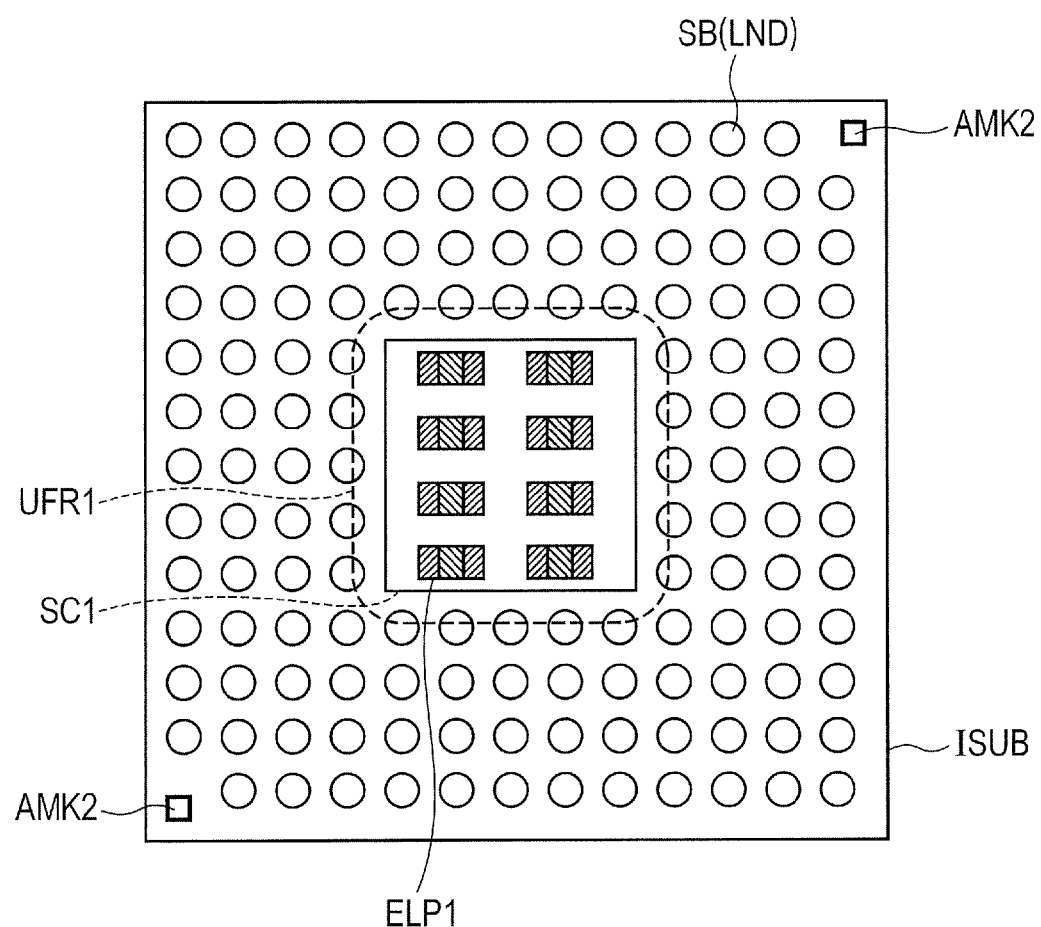
FIG. 23 is a diagram illustrating a rear surface of a wiring substrate in a semiconductor device according to a modification 2.

FIG. 23 is a diagram illustrating a rear surface SFC2 of a wiring substrate ISUB in a semiconductor device SD according to a modification 2. The semiconductor device according to this modification is identical in configuration with the semiconductor device SD according to the embodiment except that at least one second rear electrode AMK2 (conductor pattern) is provided on the rear surface SFC2.

The second rear electrode AMK2 is configured by a conductor pattern (for example, a Cu pattern) in the same layer as that of the electrodes LND, and formed in the same process as that of the electrodes LND. However, the second rear electrode AMK2 is different in at least one of size and shape from the electrodes LND. The second rear electrode AMK2 is used as a positioning mark when the electronic components ELP are mounted on the rear surface SFC2. In the example illustrated in FIG. 23, the second rear electrodes AMK2 are arranged at the respective two corners facing each other on the rear surface SFC2. In this case, the electrodes LND are not formed in a region of the rear surface SFC2 closer to an edge of the rear surface SFC2 than the second rear electrodes AMK2.

The external connection terminals SB are not formed on the second rear electrodes AMK2. With the above configuration, the shape and the size of the second rear electrodes AMK2 can be arbitrarily set. The external connection terminals SB may be formed on the second rear electrodes AMK2.

Figure 24:
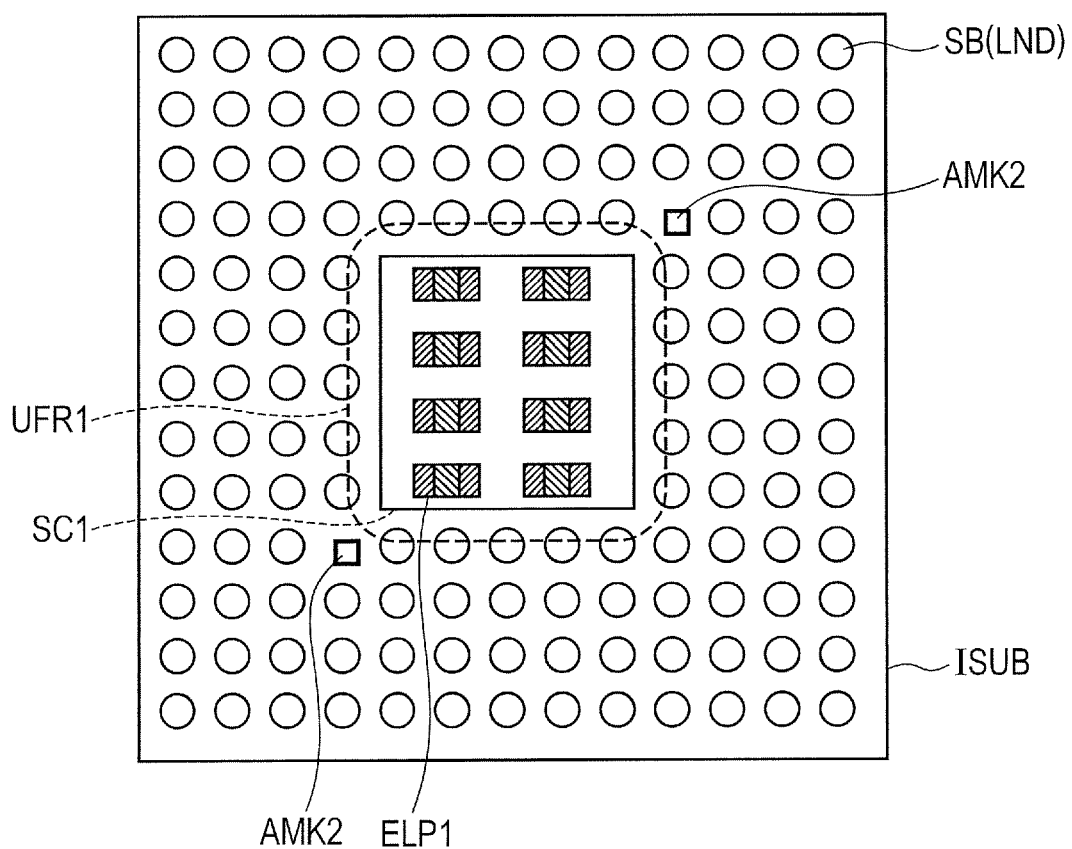
FIG. 24 is a diagram illustrating the modification of FIG. 23.

Also, as illustrated in FIG. 24, the second rear electrodes AMK2 may be arranged in regions of the rear surface SFC2 in which the electrodes LND are formed. In the example illustrated in FIG. 24, the two second rear electrodes AMK2 are arranged at positions facing each other across a region of the rear surface SFC2 which overlaps with the first semiconductor chip SC1. In other words, the second rear electrodes AMK2 are arranged at the positions facing each other across the plurality of electronic components ELP.

Figure 25:
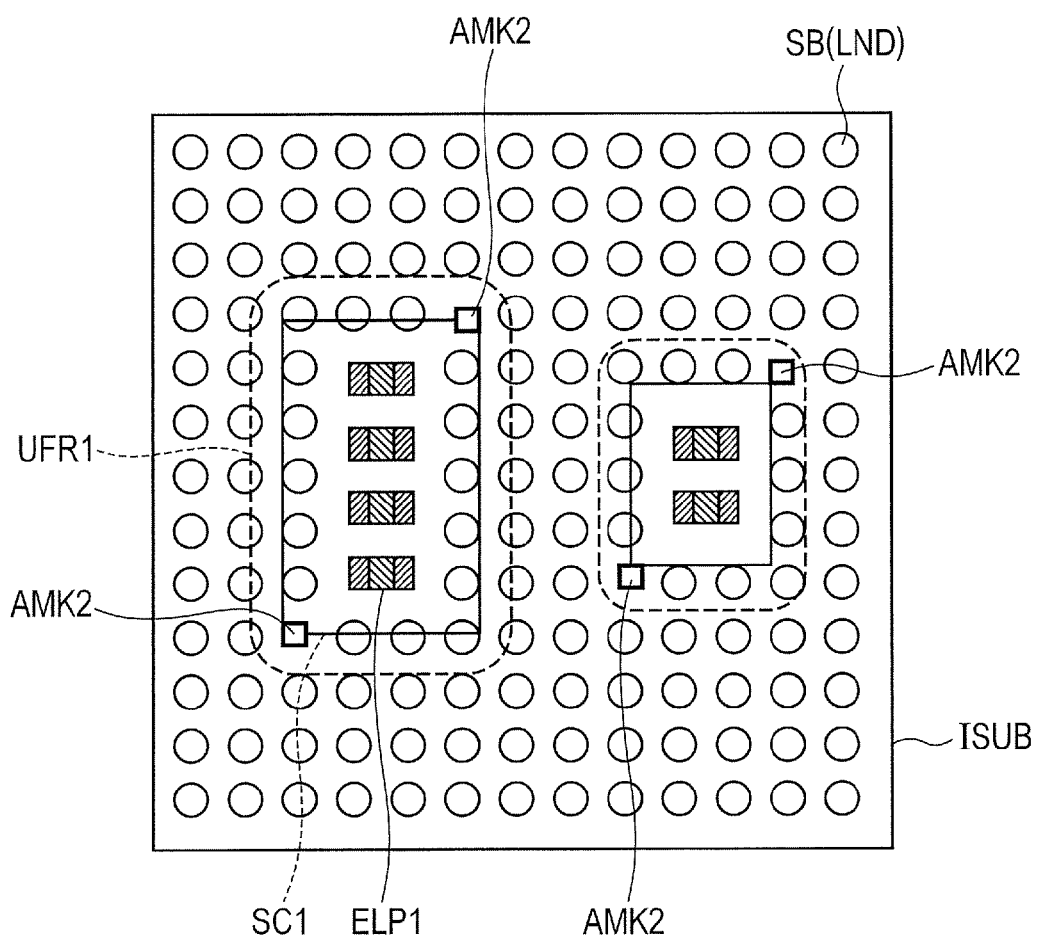
FIG. 25 is a diagram illustrating the modification of FIG. 23.
Figure 26:
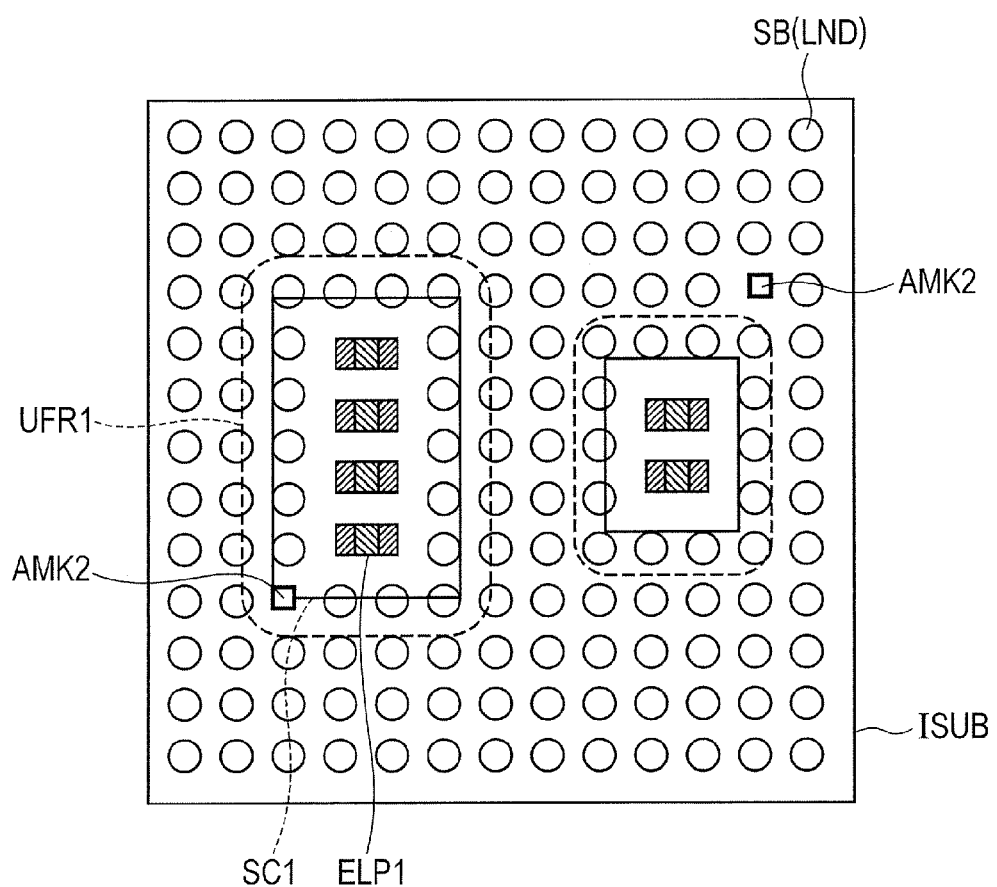
FIG. 26 is a diagram illustrating the modification of FIG. 23.
Figure 27:
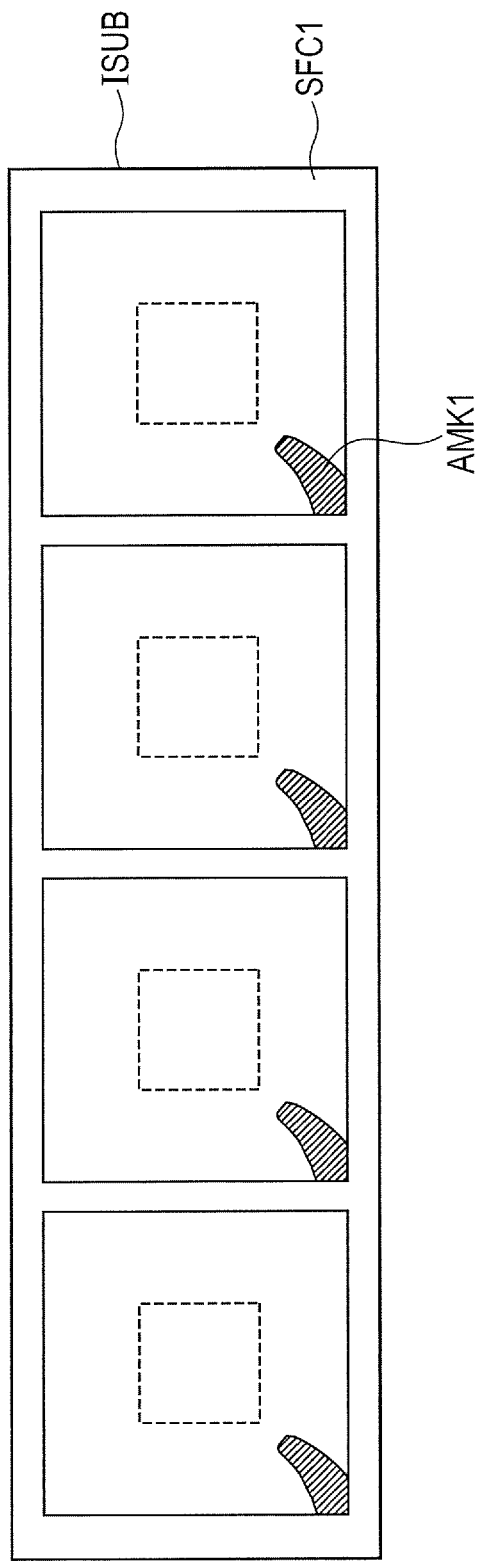
FIG. 27 is a diagram illustrating a method of manufacturing a semiconductor device according to a modification 3.

As illustrated in FIGS. 25 and 26, the second rear electrodes AMK2 may be arranged in the semiconductor device SD according to the modification 1.

In an example illustrated in FIG. 25, four second rear electrodes AMK2 are disposed. Two of those second rear electrodes AMK2 are arranged at positions facing each other across a region of the rear surface SFC2 which overlaps with the first semiconductor chip SC1, and the two remaining second rear electrodes AMK2 are arranged at positions facing each other across a region of the rear surface SFC2 which overlaps with the second semiconductor chip SC2.

In an example illustrated in FIG. 26, two second rear electrodes AMK2 are disposed. A first second rear electrode AMK2 is arranged in the vicinity of a region of the rear surface SFC2 which overlaps with the first semiconductor chip SC1, and a second rear electrode AMK2 is arranged in the vicinity of a region of the rear surface SFC2 which overlaps with the second semiconductor chip SC2.

This modification also obtains the same advantages as those in the embodiment. Also, aside from the electrodes LND, the second rear electrodes AMK2 are disposed as the positioning mark. The second rear electrodes AMK2 are different in at least one of planar shape and size from the electrodes LND. For that reason, a possibility that the electrodes LND are falsely recognized as the second rear electrodes AMK2 becomes lower. Therefore, the position of the electronic components ELP can be further prevented from being shifted when the electronic components ELP are mounted on the rear surface SFC2 of the wiring substrate ISUB.

Modification 3

The semiconductor device SD according to this modification has a sealing resin MDR instead of the lid LID. Then, the first semiconductor chip SC1 is mounted on the wiring substrate ISUB with the use of bonding wires WIR.

FIGS. 27 to 30B are diagrams illustrating a method of manufacturing the semiconductor device SD according to this modification. First, as illustrated in a plan view of FIG. 27, the wiring substrate ISUB is prepared. In a state illustrated in those figures, a plurality (for example, 1×n) of wiring substrates ISUB are connected to each other.

Then, as illustrated in a plan view of FIG. 28A and a cross-sectional view of FIG. 28B, the first semiconductor chip SC1 and the electronic components ELP are mounted on each of the main surfaces SFC1 of the plurality of wiring substrates ISUB. The first semiconductor chip SC1 is mounted on the main surface SFC1 in such a direction that the rear surface SFC4 faces the main surface SFC1 of the wiring substrate ISUB. Then, the electrode pads EL of the first semiconductor chip SC1 are connected to the wiring substrate ISUB with the use of the bonding wires WIR.

Then, as illustrated in a cross-sectional view of FIG. 29A, a mold MMD is arranged on the main surface SFC1 of the wiring substrate ISUB. The mold MMD has cavities in regions facing the respective wiring substrates ISUB. Then, the sealing resin MDR is allowed to flow into each of the plurality of cavities. Thereafter, as illustrated in FIG. 29B, the mold MMD is removed. In this way, the plurality of first semiconductor chips SC1 are sealed by the sealing resin MDR, individually. The electronic components ELP on the main surface SFC1 are also sealed by the sealing resin MDR. In this example, at least a part of the wiring substrate ISUB located on both ends thereof is not covered with the sealing resin MDR, and form with the uncovered regions LDO.

Figure 30A:
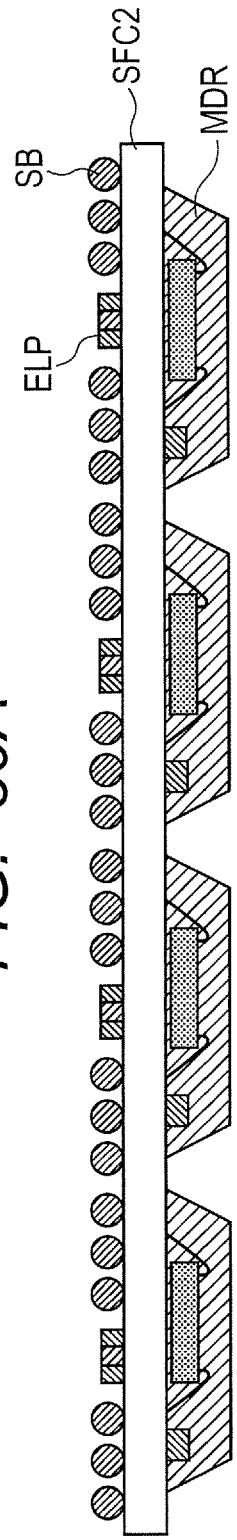
FIGS. 30A and 30B are diagrams illustrating the method of manufacturing the semiconductor device according to the modification 3.

Thereafter, as illustrated in FIG. 30A, the electronic components ELP and the external connection terminals SB are mounted on the rear surface SFC2 in such a manner that the rear surface SFC2 of the wiring substrate ISUB is turned upward. In this situation, like the embodiment, the retention jig HLD is used. The support portions PRJ of the retention jig HLD are abutted against regions (uncovered regions LDO) of the edges of the wiring substrate ISUB located on both ends thereof which are not covered with the sealing resin MDR. For that reason, even if an upper surface of the sealing resin MDR is inclined, the rear surface SFC2 of the wiring substrate ISUB can be prevented from being inclined with respect to the retention jig HLD as in the embodiment.

Figure 30B:
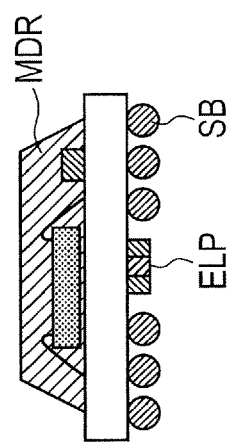

Thereafter, as illustrated in FIG. 30B, the wiring substrate ISUB is divided, and the semiconductor device SD is diced.

Figure 31:
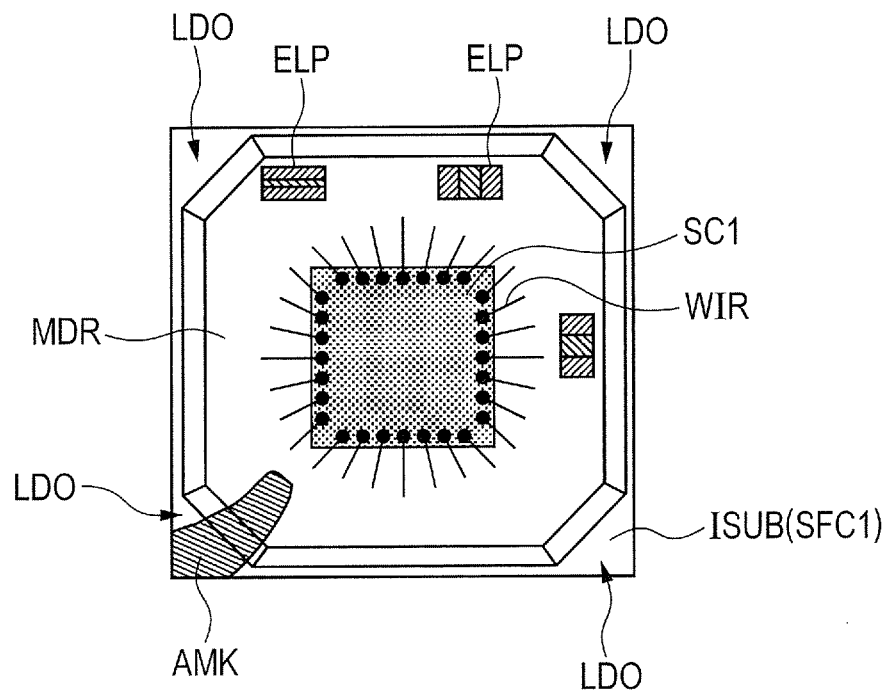
FIG. 31 is a top view of the semiconductor device.

FIG. 31 is a top view of the semiconductor device SD according to this modification. A shape of an upper surface of the sealing resin MDR is substantially identical with the shape of the upper surface of the lid LID according to the modification 1 except that no edge EDG is provided. A part of the alignment mark AMK1 is sealed with the sealing resin MDR.

Figure 32:
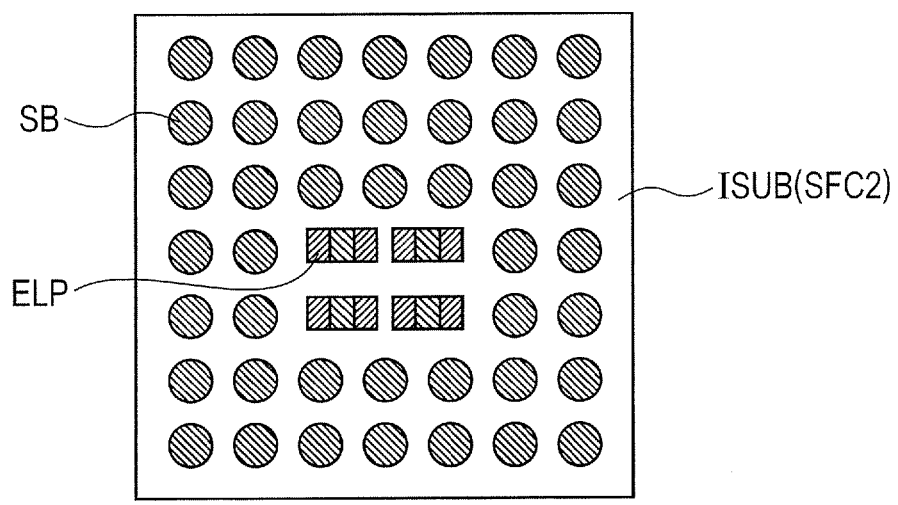
FIG. 32 is a rear view of the semiconductor device illustrated in FIG. 31.

FIG. 32 is a rear view of the semiconductor device SD illustrated in FIG. 31. Also, in this modification, a plurality of external connection terminals SB are disposed on the rear surface SFC2 of the wiring substrate ISUB. A plurality of electronic components ELP are mounted in a region of the rear surface SFC2 which overlaps with the first semiconductor chip SC1. Those electronic components ELP are electrically connected to the first semiconductor chip SC1.

Figure 33:
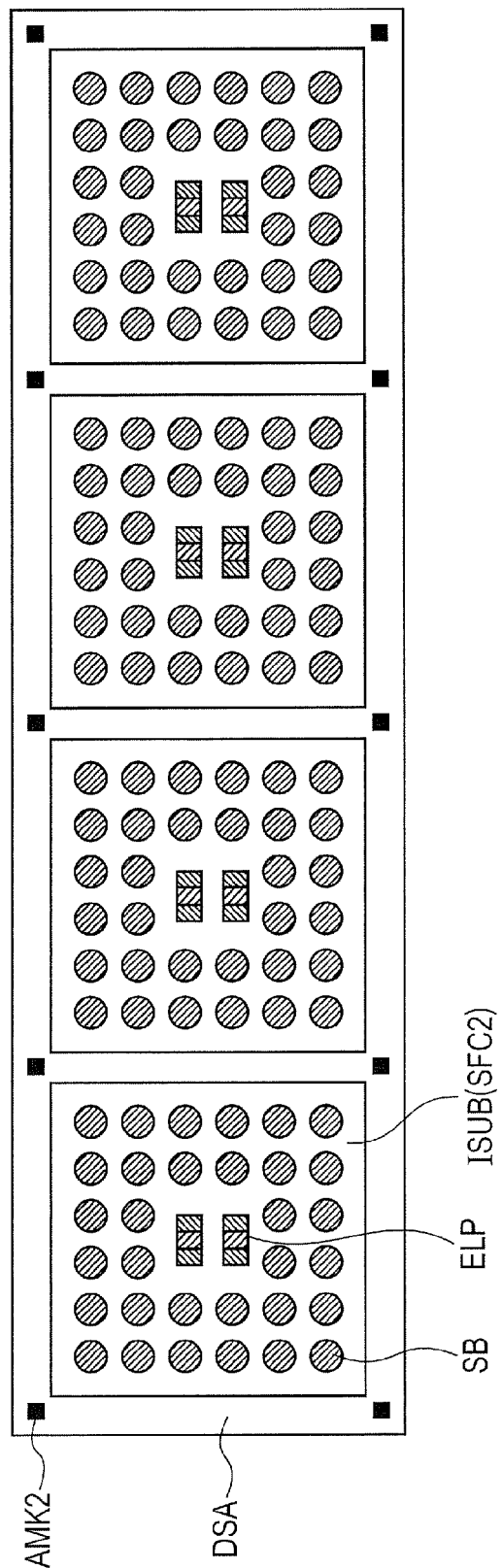
FIG. 33 is a rear view illustrating a modification of the semiconductor device.

As illustrated in FIG. 33, the second rear electrodes AMK2 shown in the modification 2 may be disposed on the rear surface SFC2 of the wiring substrate ISUB. In the example illustrated in FIG. 33, the second rear electrodes AMK2 are disposed in a dicing region DSA.

Figure 34:
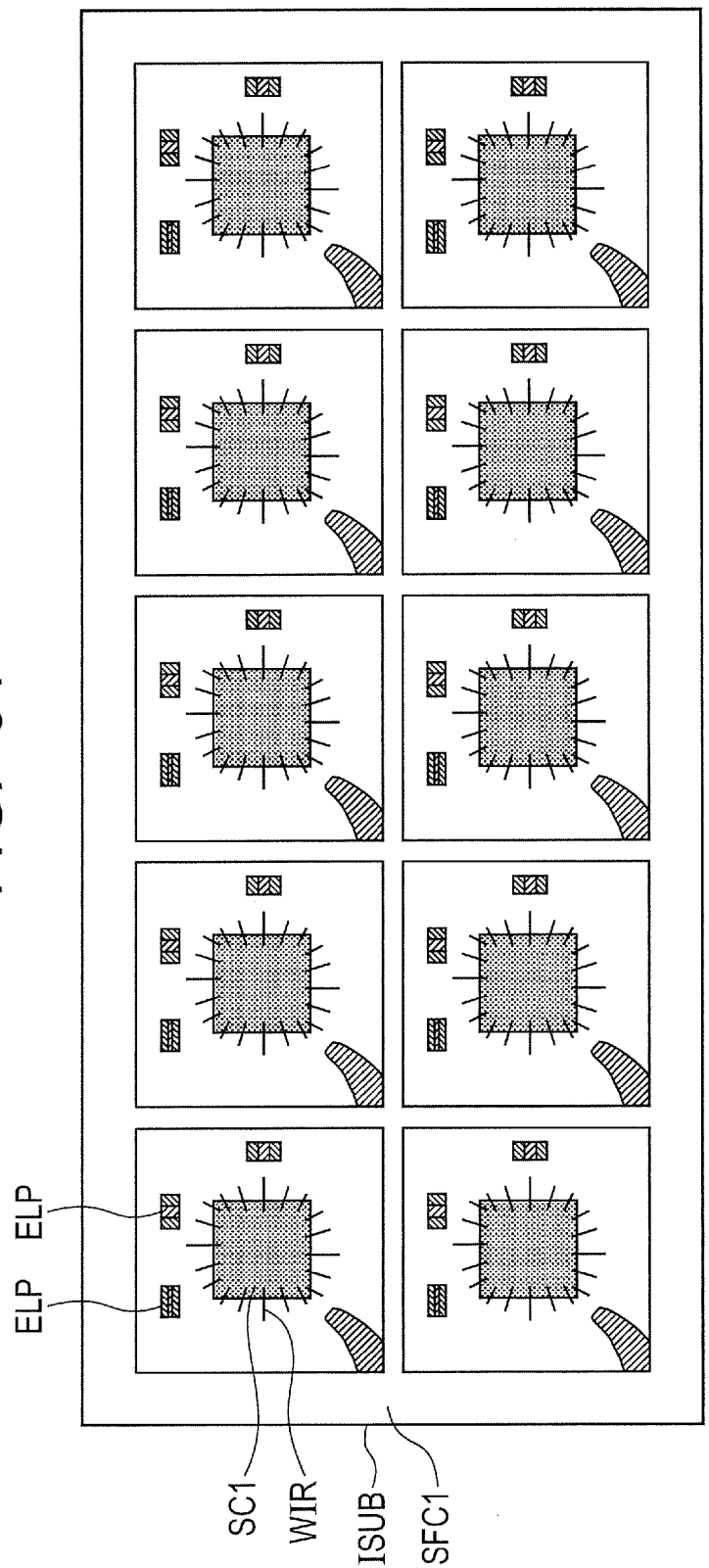
FIG. 34 is a rear view illustrating the modification of the semiconductor device.
Figure 35:
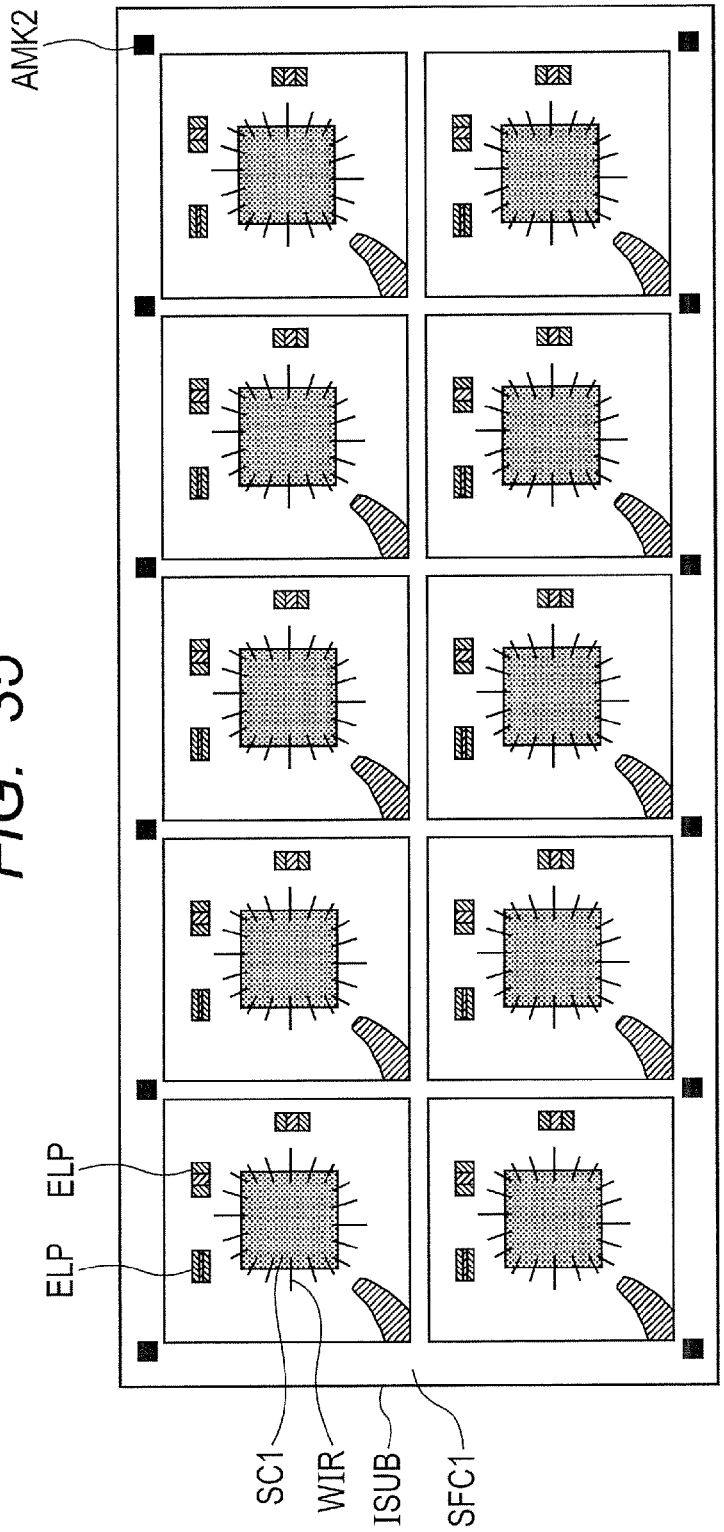
FIG. 35 is a rear view illustrating the modification of the semiconductor device.

Also, as illustrated in FIG. 34, in a state where the semiconductor device SD has not yet been diced, n×m wiring substrates ISUB may be connected to each other. In this case, as illustrated in FIG. 35, the second rear electrodes AMK2 may be disposed.

Figure 36:
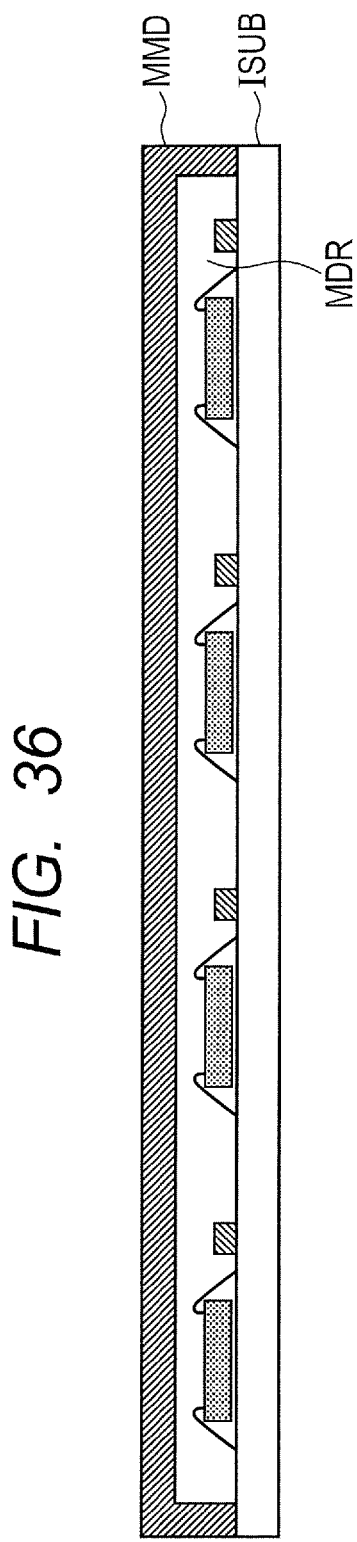
FIG. 36 is a cross-sectional view illustrating the modification of the semiconductor device.

Also, as illustrated in FIG. 36, the mold MMD may be shaped to have one cavity. In this case, a plurality of first semiconductor chips SC1, and a plurality of electronic components ELP are located within the same cavity, and the first semiconductor chips SC1 and the electronic components ELP are sealed by the sealing resin MDR in a lump. Also, in this example, at least a part of the edges of the wiring substrate ISUB located on both ends thereof is not sealed by the sealing resin MDR. Therefore, the support portions PRJ of the retention jig HLD are abutted against regions (uncovered regions LDO) of the edges of the wiring substrate ISUB located on both ends thereof which are not covered with the sealing resin MDR. For that reason, the rear surface SFC2 of the wiring substrate ISUB can be prevented from being inclined with respect to the retention jig HLD.

The invention made by the present inventors has been described above specifically on the basis of the embodiments. However, the present invention is not limited to the embodiments, but can be variously changed without departing from the spirit of the invention.

What is claimed is:

1. A semiconductor device, comprising:
   a first semiconductor chip having a first main surface and a first rear surface which is an opposite surface of the first main surface;
   a rectangular wiring substrate having a second main surface and a second rear surface which is an opposite surface of the second main surface, in which the first semiconductor chip is mounted on the second main surface;
   a covering member that covers the second main surface of the wiring substrate and the first semiconductor chip, the covering member including a center portion, a slope portion and an edge portion, the center portion and the edge portion extend in parallel with a first plane, the slope portion is sloped to be closer to the wiring substrate and the edge portion as the slope portion is farther from the center portion; and
   an electronic component that is mounted on the second rear surface of the wiring substrate,
   wherein the second main surface of the wiring substrate has uncovered regions that are not covered with the covering member at at least two corners facing each other.

2. The semiconductor device according to claim 1, wherein the uncovered regions are provided at four corners of the wiring substrate.

3. The semiconductor device according to claim 2,
wherein a planar shape of the covering member is rectangular, and notched at the respective four corners, and
wherein four corners of the covering member overlap with the four corners of the wiring substrate.

4. The semiconductor device according to claim 1,
wherein a width of portions of the uncovered regions which overlap with a diagonal line of the wiring substrate is equal to or larger than 1 mm, and equal to or smaller than 6 mm.

5. The semiconductor device according to claim 1,
wherein the first semiconductor chip has a plurality of first electrodes on the first main surface,
wherein the wiring substrate has a plurality of second electrodes on the second main surface,
wherein the first semiconductor chip is mounted on the wiring substrate in such a direction that the first main surface faces the second main surface, and
wherein the plurality of first electrodes are connected to the plurality of second electrodes.

6. A semiconductor device, comprising:
a first semiconductor chip having a first main surface and a first rear surface which is an opposite surface of the first main surface;
a rectangular wiring substrate having a second main surface and a second rear surface which is an opposite surface of the second main surface, in which the first semiconductor chip is mounted on the second main surface;
a covering member that covers the second main surface of the wiring substrate, and the first semiconductor chip;
an electronic component that is mounted on the second rear surface of the wiring substrate,
a plurality of first rear electrodes that are disposed on the second rear surface of the wiring substrate;
external connection terminals that are disposed for the respective first rear electrodes; and
at least one conductor pattern that is disposed on the second surface of the wiring substrate, and different in at least one of shape and size from the plurality of first rear electrodes,
wherein the second main surface of the wiring substrate has uncovered regions that are not covered with the covering member at at least two corners facing each other.

7. The semiconductor device according to claim 6,
wherein the external connection terminals are not formed in the conductor pattern.

8. A semiconductor device, comprising:
a first semiconductor chip having a first main surface and a first rear surface which is an opposite surface of the first main surface;
a rectangular wiring substrate having a second main surface and a second rear surface which is an opposite surface of the second main surface, in which the first semiconductor chip is mounted on the second main surface;
a covering member that covers the second main surface of the wiring substrate, and the first semiconductor chip; and
an electronic component that is mounted on the second rear surface of the wiring substrate,
wherein the second main surface of the wiring substrate has uncovered regions that are not covered with the covering member at at least two corners facing each other, and
wherein the covering member is fixed to a first side of the wiring substrate, and a second side facing the first side, and not fixed to a third side and a fourth side which are remaining sides of the wiring substrate.

9. The semiconductor device according to claim 8,
wherein a planar shape of the first semiconductor chip is rectangular, and
wherein a long side of the first semiconductor chip is disposed along the third side of the wiring substrate.

10. The semiconductor device according to claim 9, further comprising: a second semiconductor chip having a fifth main surface, and is rectangular in a planar shape,
wherein the second semiconductor chip has a plurality of third electrodes on the fifth main surface,
wherein the wiring substrate has a plurality of fourth electrodes on the second main surface,
wherein the second semiconductor chip is mounted on the wiring substrate in such a direction that the fifth main surface faces the second main surface,
wherein the plurality of third electrodes are connected to the plurality of fourth electrodes, and
wherein a long side of the second semiconductor chip is disposed along the third side of the wiring substrate.

* * * * *